United States Patent
Davis et al.

(10) Patent No.: US 11,973,051 B2
(45) Date of Patent: Apr. 30, 2024

(54) MOLDED DIRECT CONTACT INTERCONNECT STRUCTURE WITHOUT CAPTURE PADS AND METHOD FOR THE SAME

(71) Applicant: Deca Technologies USA, Inc., Tempe, AZ (US)

(72) Inventors: Robin Davis, Vancouver, WA (US); Timothy L Olson, Phoenix, AZ (US); Craig Bishop, Scottsdale, AZ (US); Clifford Sandstrom, Richfield, MN (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/195,090

(22) Filed: May 9, 2023

(65) Prior Publication Data

US 2023/0387060 A1    Nov. 30, 2023

Related U.S. Application Data

(60) Provisional application No. 63/347,516, filed on May 31, 2022.

(51) Int. Cl.
*H01L 23/00* (2006.01)
*H01L 21/56* (2006.01)

(52) U.S. Cl.
CPC ............ *H01L 24/20* (2013.01); *H01L 21/568* (2013.01); *H01L 24/19* (2013.01); *H01L 2224/19* (2013.01); *H01L 2224/21* (2013.01)

(58) Field of Classification Search
CPC ..... H01L 24/20; H01L 24/19; H01L 2224/19; H01L 2224/21
See application file for complete search history.

(56) References Cited

U.S. PATENT DOCUMENTS 5,570,274 A   10/1996   Saito
5,790,384 A    8/1998   Ahmad
(Continued)

FOREIGN PATENT DOCUMENTS

CN    112234035 A    1/2021

OTHER PUBLICATIONS

Kurita, Yoichiro et al. "Fan-Out WLP With Highly Flexible Design Capabilities." 3rd Electronic System-Integration Technology Conference (ESTC), Sep. 13-16, 2010.
(Continued)

*Primary Examiner* — Fernando L Toledo
*Assistant Examiner* — Neil R Prasad
(74) *Attorney, Agent, or Firm* — Booth Udall Fuller, PLC; Bryce W. Burnham

(57) ABSTRACT

An electronic assembly may include a component comprising conductive studs disposed over an active layer of the component. A first encapsulant layer may be disposed around four side surfaces of the component, over the active layer of the component, and contacting at least a portion of the sides of the conductive studs. A substantially planar surface may be disposed over the active layer of the component, wherein the substantially planar surface comprises ends of the conductive studs and the first encapsulant layer. The first encapsulant layer comprises a roughness less than 500 nanometers. First conductive elements may be disposed over the encapsulant and coupled with the conductive studs. A second layer of encapsulant may be disposed over the first conductive elements.

30 Claims, 15 Drawing Sheets

(56) References Cited

U.S. PATENT DOCUMENTS

| | | | |
|---|---|---|---|
| 6,133,626 | A | 10/2000 | Hawke |
| 6,294,406 | B1 | 9/2001 | Bertin |
| 7,569,422 | B2 | 8/2009 | Lin |
| 8,018,036 | B2 | 9/2011 | Goh |
| 8,164,171 | B2 | 4/2012 | Lin |
| 8,503,186 | B2 | 8/2013 | Lin |
| 8,653,647 | B2 | 2/2014 | Masuda |
| 8,664,044 | B2 | 3/2014 | Jin |
| 8,804,360 | B2 | 8/2014 | Lin |
| 9,368,438 | B2 | 6/2016 | Lin |
| 9,385,074 | B2 | 7/2016 | Pendse |
| 9,391,041 | B2 | 7/2016 | Lin |
| 9,553,000 | B2 | 1/2017 | Yu |
| 9,601,463 | B2 | 3/2017 | Yu |
| 9,613,931 | B2 | 4/2017 | Lin |
| 9,685,390 | B2 | 6/2017 | Hu |
| 9,704,735 | B2 | 7/2017 | Konchady |
| 9,793,231 | B2 | 10/2017 | Chen |
| 10,056,351 | B2 | 8/2018 | Yu |
| 10,229,892 | B2 | 3/2019 | Appelt |
| 10,325,879 | B2 | 6/2019 | Yu |
| 10,490,468 | B2 | 11/2019 | Tsai |
| 10,770,416 | B2 | 9/2020 | Kim |
| 10,879,224 | B2 | 12/2020 | Chen |
| 11,024,605 | B2 | 6/2021 | Chen |
| 11,171,076 | B2 | 11/2021 | Yu |
| 11,211,360 | B2 | 12/2021 | Huang |
| 11,276,656 | B2 | 3/2022 | Chen |
| 11,502,062 | B2 | 11/2022 | Chen |
| 2010/0290191 | A1* | 11/2010 | Lin .................... H01L 24/82 361/764 |
| 2019/0333893 | A1 | 10/2019 | Yu |
| 2019/0341351 | A1 | 11/2019 | May |
| 2020/0058627 | A1* | 2/2020 | Chen ............... H01L 23/3135 |
| 2021/0066263 | A1 | 3/2021 | Chen |
| 2021/0366854 | A1* | 11/2021 | Yu .................... H01L 23/481 |
| 2021/0366877 | A1* | 11/2021 | Wu ................. H01L 23/5384 |
| 2022/0005760 | A1 | 1/2022 | Dadvand |

OTHER PUBLICATIONS

Motohasi, N., et al. System in Wafer Level Package Technology with RDL first process, 2011 Electronic Components and Technology Conference pp. 59-64.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB (Embedded Wafer Level BGA) Packaging." ECTC, 2012. pp. 1388-1393.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Jin, Yonggang et al. "Enhanced Fan-Out WLP for High Power Device Packaging." International Electronics Manufacturing Technology Conference (IEMT), 2012.

Anandan, Ramasamy et al. "Embedded Wafer Level BGA (EWLB)—Extra-Small and ELGA Packages." Electronics Packaging Technology Conference (EPTC), 2011. pp. 412-416.

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Stahr, Hannes et al. "Embedded Components on the Way to Industrialisation." 2011. https://ats.net/wp-content/uploads/2017/03/SMTA_Austin_TX_2011_ECP_Paper.pdf.

* cited by examiner

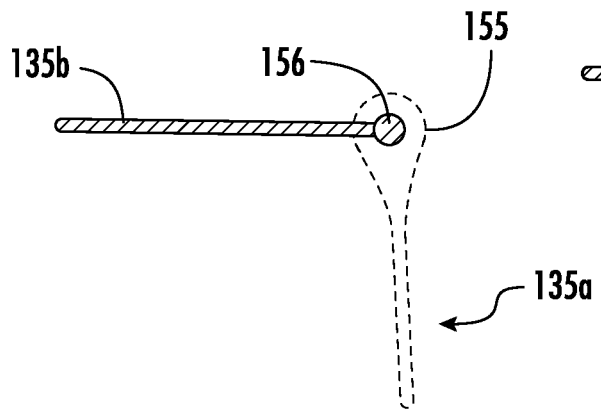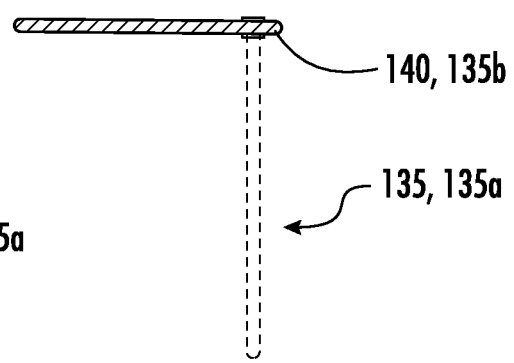
FIG. 2Sa
FIG. 2Sb
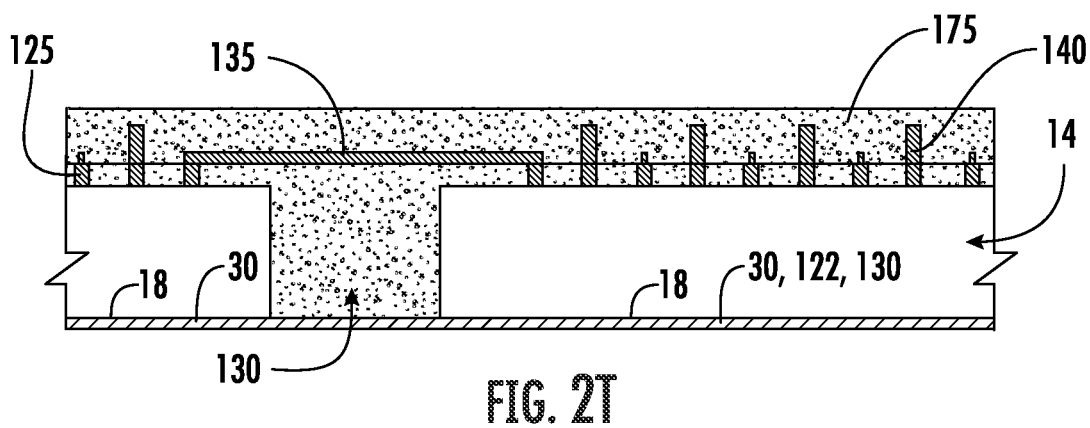
FIG. 2T
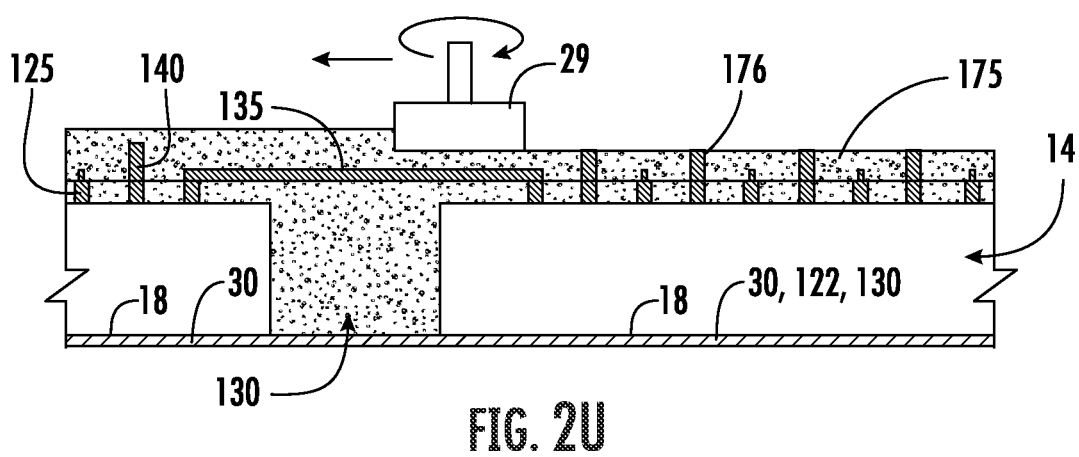
FIG. 2U

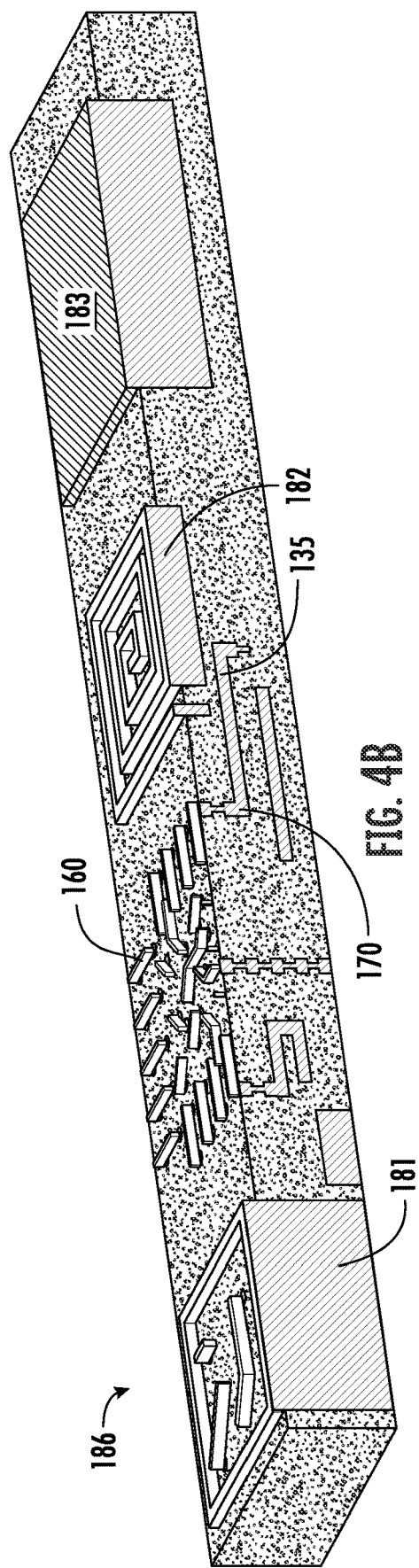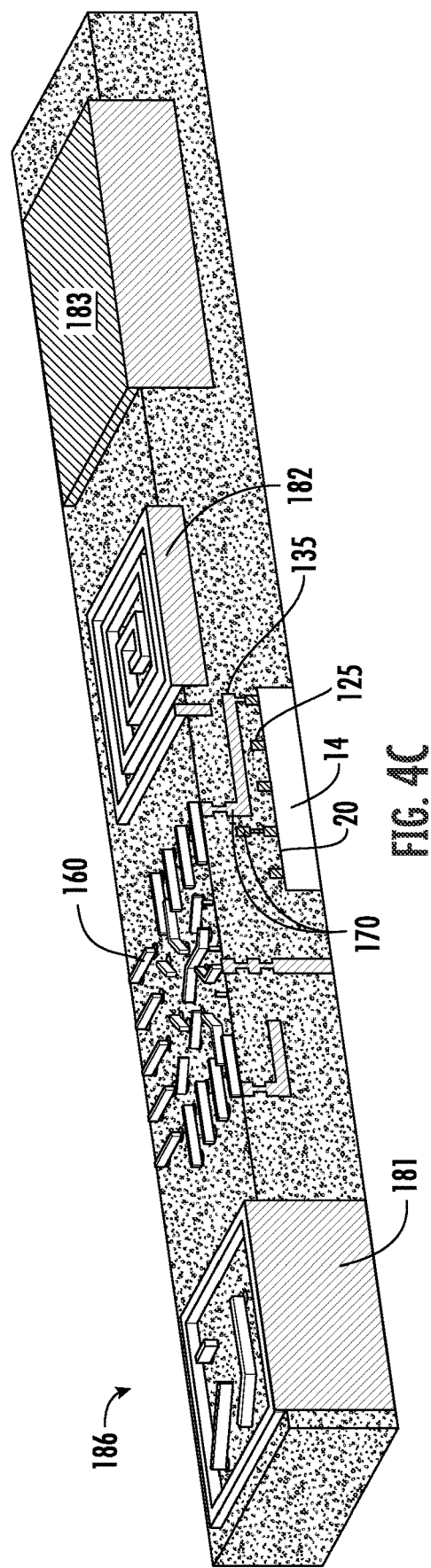

MOLDED DIRECT CONTACT INTERCONNECT STRUCTURE WITHOUT CAPTURE PADS AND METHOD FOR THE SAME

CROSS-REFERENCE TO RELATED APPLICATIONS

This application claims the benefit of U.S. Provisional Application No. 63/347,516, entitled "Molded Direct Contact Interconnect Build-Up Structure Without Capture Pads," which was filed May 31, 2022, the entire disclosure of which is hereby incorporated herein by this reference.

TECHNICAL FIELD

Embodiments of the present disclosure relate to the field of electrical assemblies and more particularly to molded direct contact interconnect build-up structures or multi-layer structures without capture pads and methods of making the same.

BACKGROUND

Semiconductor assemblies, devices, packages, substrates, and interposers are commonly found in modern electronic products. Production of semiconductor devices involves a multistep build-up of components. Conventional interconnect structures alternate dielectric and conductive layers. An opening or via is created in the dielectric to allow connectivity from one layer to another. On the conductive layers, capture pads are required for the vias to correct for inconsistencies in manufacture. Use of these conventional capture pads impacts the ability to construct compact or high-density structures due to limits on routing density. Additionally, the process for opening vias limits the size and shape of the connections between conductive layers.

SUMMARY

An opportunity exists for improved semiconductor assemblies, including applications for semiconductor manufacturing. Accordingly, in an aspect of the disclosure, an electronic assembly may comprise a component comprising conductive studs over an active layer of the component. A first layer of encapsulant may be disposed around four side surfaces of the component, over the active layer of the component, and contacting at least a portion of the sides of the conductive studs. A substantially planar surface may be disposed over the active layer of the component, wherein the substantially planar surface comprises ends of the conductive studs and the first layer of encapsulant. A first conductive layer and first conductive stumps may be disposed over the first layer of encapsulant and configured to be electrically coupled with the conductive studs of the component. A second layer of encapsulant may be disposed over the first conductive layer and surround at least a portion of the first conductive stumps. Ends of the first conductive stumps may be exposed with respect to the second layer of encapsulant. A second conductive layer and second conductive stumps may be disposed over the second layer of encapsulant and configured to be electrically coupled with the first conductive layer and first conductive stumps. A third layer of encapsulant may be disposed over the second conductive layer and surround at least a portion of the second conductive stumps. Ends of the second conductive stumps may be exposed with respect to the third layer of encapsulant. A conductive contact may be disposed over, or within, the third layer of encapsulant and be configured to be electrically coupled to the component through one or more of the first conductive stump and the second conductive stumps. The first layer of encapsulant, the second layer of encapsulant, and the third layer of encapsulant comprise a surface roughness of less than 500 nanometers (nm) over a characteristic measurement distance. The first conductive layer and the second conductive layer may comprise lower surfaces comprising corresponding surface roughness less than 500 nm over a characteristic measurement distance. The first conductive stumps may be formed of a single layer of material and at least a portion of the sidewalls of the first conductive stumps directly contact the second encapsulant.

In some embodiments, the electronic assembly further comprises at least a portion of the first conductive layer or the second conductive layer being formed using unit specific patterning, such that at least a portion of the first conductive layer comprises a misalignment less than an average misalignment for the first conductive layer, and at least a portion of the second conductive layer comprises a misalignment less than an average misalignment for the second conductive layer. The second layer of encapsulant and the third layer of encapsulant may be formed without components disposed therein. The conductive contact comprises one or more of an input electrical contact, an output electrical contact, an IO contact, a power contact, a ground contact, a clock contact, electrical contacts, a bump, a solder ball, a solder bump, a BGA, a LGA, contact pads, copper pillars, and copper pillars with solder, to couple with structures outside the electronic assembly. The first encapsulant layer, the second encapsulant layer, and the third encapsulant layer may each comprise an organic material with filler, a mold compound with filler, a composite material with filler, an epoxy resin with filler, or an epoxy acrylate with filler. Filler particles at a boundary of the first encapsulant layer, the second encapsulant layer, and the third encapsulant layer may comprise non-spherical shapes from grinding, polishing, or chemical mechanical polishing (CMP). The conductive stumps may be formed with a cross-sectional distance in a first direction less than or equal to (or about) 12 µm and at a pitch in the first direction of less than or equal to (or about) 25 µm. The first conductive layer may comprise a redistribution layer (RDL) with a line and space width of less than or equal to (or about) 5 µm.

In certain aspects, the disclosure is directed to semiconductor assemblies, comprising a component comprising conductive studs disposed over an active layer of the component. A first encapsulant layer may be disposed around four side surfaces of the component, over the active layer of the component, and contacting at least a portion of the sides of the conductive studs. A substantially planar surface may be disposed over the active layer of the component. The substantially planar surface may comprise ends of the conductive studs and a planar surface of the first encapsulant layer, wherein the planar surface of the first encapsulant layer comprises a roughness less than 500 nm over a characteristic measurement distance. First conductive elements may be disposed over the first encapsulant layer and configured to be electrically coupled with the conductive studs of the component. A second layer of encapsulant may be disposed over, and surrounding at least a portion of, the first conductive elements and the first encapsulant layer, wherein at least a portion of the first conductive elements are exposed with respect to the second layer of encapsulant. A conductive contact may be disposed over, or within, the second layer of encapsulant for IO interconnection and configured to be electrically coupled through the first conductive elements to the component.

In some embodiments, the electronic assembly may further comprise the conductive elements comprising conductive stumps and a first conductive layer, wherein the first conductive layer comprises one or more of a redistribution layer (RDL), trace, or contact pad. Alternating layers of additional conductive elements with alternating layers of encapsulant may form two to twelve layers of conductive elements. At least a portion of the first conductive elements may be formed using unit specific patterning, such that at least a portion of the first conductive layer comprises a misalignment less than an average misalignment for the first conductive layer. The second layer of encapsulant may be formed without components disposed therein. The first encapsulant layer and the second encapsulant layer may each comprise an organic material with filler, a mold compound with filler, a composite material with filler, an epoxy resin with filler, or an epoxy acrylate with filler. The filler particles at a boundary of the first encapsulant layer and the second encapsulant layer may comprise non-spherical shapes from grinding, polishing, or CMP. The conductive contact may comprise one or more of an input electrical contact, an output electrical contact, an IO contact, a power contact, a ground contact, a clock contact, electrical contacts, a bump, a solder ball, a solder bump, a BGA, a LGA, contact pads, copper pillars, and copper pillars with solder, to couple with structures outside the electronic assembly. The first conductive elements may comprise conductive stumps, wherein the conductive stumps are formed of a single layer of material and sidewalls of the first conductive stumps directly contact the second encapsulant. The first conductive elements may comprise conductive stumps, wherein the conductive stumps are formed with a cross-sectional distance in a first direction less than or equal to 35 μm or 12 μm and at a pitch in the first direction of less than or equal to 45 μm or 25 μm. The first conductive elements may comprise a first conductive layer, wherein the first conductive layer comprises a RDL with a line and space width of less than or equal to 10 μm or 5 μm. The first conductive elements may comprise a first conductive layer, wherein the first conductive layer comprises a corresponding surface roughness within a range of 5 to 500 nm over a characteristic measurement distance.

In certain aspects, the disclosure is directed to semiconductor assemblies, comprising a component comprising conductive studs disposed over a first surface of the component. A first encapsulant layer may be disposed around four side surfaces of the component, over the first surface of the component, and contacting at least a portion of the sides of the conductive studs. A substantially planar surface may be disposed over the first surface of the component. The substantially planar surface may comprise ends of the conductive studs and a planar surface of the first encapsulant layer, wherein the planar surface of the first encapsulant layer comprises a roughness less than 500 nanometers (nm) over a characteristic measurement distance. The first conductive elements may be disposed over the first encapsulant layer and configured to be electrically coupled with the conductive studs of the component.

In some embodiments, the electronic assembly may further comprise the ends of the conductive studs being recessed below the planar surface of the first encapsulant by a distance of 10 μm or less. The first conductive elements may comprise one or more of conductive stumps and a first conductive layer, wherein the first conductive layer comprises one or more of a redistribution layer (RDL), trace, or contact pad. The first conductive elements may be formed with a second encapsulant layer formed as a single encapsulant disposed over the first conductive elements and the first encapsulant layer. One or more additional layers of alternating conductive elements and layers of encapsulant may form two or more conductive elements, wherein the two or more conductive elements comprise two or more layers of conductive stumps disposed over a first surface of the component, wherein a connection between conductive stumps between layers is done without use of capture pads. The second layer of encapsulant may be formed without components disposed therein. The second layer of encapsulant may comprise one or more additional components disposed therein. Conductive contacts may comprise one or more of an input electrical contact, an output electrical contact, an IO contact, power contact, ground contact, clock contact, electrical contacts, a bump, a solder ball, a solder bump, a BGA, a LGA, contact pads, copper pillars, and copper pillars with solder, to couple with devices outside the electronic assembly. The first conductive stumps may be formed of a single layer of material and at least a portion of sidewalls of the first conductive stumps directly contacting the second encapsulant. The conductive stumps may be formed with a minimum width less than or equal to (or about) 400-10 μm, or about 400 μm or about 12 μm and at a minimum pitch of less than or equal to (or about) 500-20 μm. The first conductive element may further comprise a trace with a line and space width of less than or equal to 10 μm or 5 μm. A first conductive layer may comprise a lower surface comprising a surface roughness less than 500 nm over a characteristic measurement distance.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that she can be her own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain, and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 4A-4C illustrate various views in the process of forming molded direct contact interconnect build-up or multi-layer structures comprising shielding, inductors, and other structures.

Figure 1A:
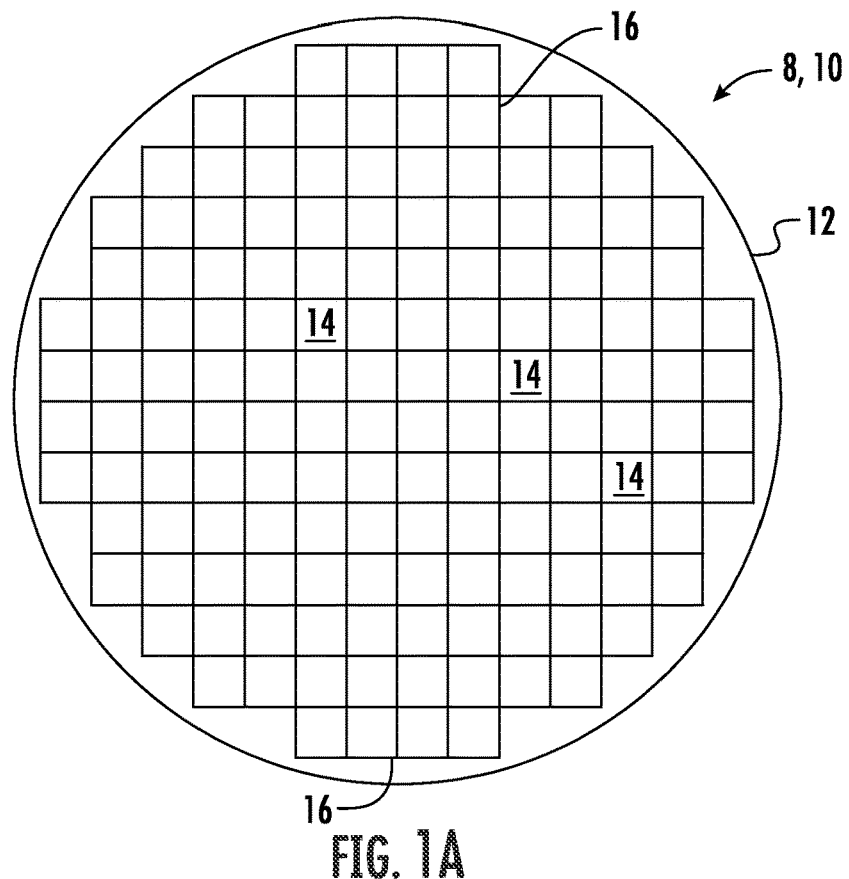
FIG. 1A shows a planar view of a native semiconductor wafer with a base substrate material 12 having a plurality of components or semiconductor chips separated by a non-active, inter-chip wafer area or saw street.

This disclosure, its aspects and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

DETAILED DESCRIPTION

This disclosure relates to molded direct contact interconnect build-up or multi-layer structures, such as for use with semiconductor assemblies, structures, devices, and packages. In some instances, the molded direct contact interconnect build-up or multi-layer structures may comprise routing for semiconductor assemblies or packages comprising different pitches, such as high density and ultra-high density as described more fully herein.

Molded direct contact interconnect build-up or multi-layer structures (and method for making and using the same) may comprise, or provide: (i) 2 micrometer line and space routing, (ii) removal of capture pads for vias between build-up or multi-layer layers, (iii) cost savings by removing polyimide and other polymers from the build-up or multi-layer layers, using instead mold compound, (iv) facilitate ultra-high-density connections, and (v) facilitate continuous metal structures across build-up or multi-layer layers.

At least some of the above advantages are available at least in part by using unit specific patterning such as patterning (custom lithography) and build-up or multi-layer or multi-layer interconnect structures such as a frontside build-up or multi-layer interconnect structure, which is also known under the trademark "Adaptive Patterning," referred to as "AP." Unit specific patterning: (i) allows for the use of high-speed component (or chip) attach for components and semiconductor chips and (ii) AP will ensure alignment for high density interconnects with the molded direct contact interconnect build-up or multi-layer structures.

This application hereby incorporates by reference the entirety of the disclosures of: (i) U.S. patent application Ser. No. 13/891,006, titled "Semiconductor Device and Method of Adaptive Patterning for Panelized Packaging," filed May 9, 2013, and issued as U.S. Pat. No. 9,196,509; and (ii) U.S. patent application Ser. No. 13/893,117, titled "Adaptive Patterning for Panelized Packaging," filed May 13, 2013, and issued as U.S. Pat. No. 8,826,221.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. Are illustrative representations and are not necessarily drawn to scale.

This disclosure, its aspects, and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

FIG. 1A shows a plan or top view of a substrate 8, which may comprise a semiconductor wafer or native wafer 10 with a base substrate material 12, such as, without limitation, silicon, silicon dioxide, germanium, gallium arsenide, indium phosphide, gallium nitride, silicon nitride, or silicon carbide, for the base material or structural support. A plurality of components or components 14 can be formed on wafer 10 and be separated by a non-active, inter-component wafer area or saw street 16 as described above. The saw street 16 can provide cutting areas to singulate the semiconductor wafer 10 into the individual components or semiconductor component 14. In other instances, integrated passive devices (IPDs), either passive or active bridge chips, or other suitable devices that become embedded devices can be formed on a substrate 8 formed of glass, ceramic, or other suitable material for providing structural support for subsequent processing.

Each component 14 may comprise one or more active devices, passive devices, or both active devices and passive devices. In some instances, the component 14 may be formed without active and passive devices, and be used for transmission or routing, such as by comprising TSVs for vertical interconnect. For example, the component 14 may be formed as a bridge chip with only electrical routing and with copper studs of the semiconductor chip electrically connected or coupled with wiring, routing, or RDL. The component 14 may also be only a dummy substrate with no electrical function, but rather act as structural element and may or may not include copper studs.

The component 14 comprises semiconductor chips and semiconductor die that comprise a backside or back surface 18 and an active layer or first surface 20 opposite the backside 18. In some instances, both faces of the component 14 will be active. In any event, the active layer contains one or more analog, or digital circuits implemented as active devices, conductive layers, and dielectric layers formed within or on the chip and electrically interconnected according to the electrical design and function of the semiconductor chip. In some instances, passive devices may also be integrated as part of the semiconductor chip or semiconductor die. The component 14 may comprise circuits that may include one or more transistors, diodes, and other circuit elements formed within the active layer to implement analog circuits or digital circuits, such as DSP, ASIC, memory, or other signal processing circuits. Digital circuits may include RF circuits, LED, LCOS, CIS, transistor, optoelectronic, MEMS and the like. The component 14 may also contain IPDs such as inductors, capacitors, and resistors, for RF signal processing, digital power line control or other functions. The component 14 may be formed on a native wafer. In some instances, a wafer level process may be used to produce many packages simultaneously on a carrier. In other instances, the package may be formed as part of a reconstituted wafer and may comprise multiple components or chips molded together.

Figure 1B:
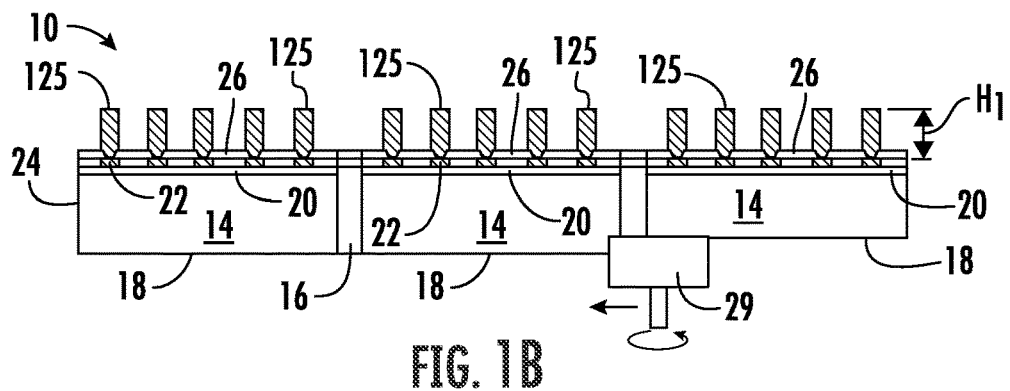
FIGS. 1B and 1C illustrate cross-sectional side views of a portion of the semiconductor wafer from FIG. 1A.

FIG. 1B illustrates a cross-sectional view of a portion of semiconductor wafer 10. Each component 14 is shown comprising a backside or back surface 18 and an active layer 20 opposite the backside. However, as noted above, in some instances the component 14 may not comprise and active layer 20.

An electrically conductive layer or contact pads 22 is formed over active layer 20 using PVD, CVD, electrolytic plating, electroless plating process, or other suitable metal deposition process. Conductive layer 22 can be one or more layers of aluminum (Al), copper (Cu), tin (Sn), nickel (Ni), gold (Au), palladium (Pd), silver (Ag), cobalt (Co), platinum (Pt), or other suitable electrically conductive material. Conductive layer 22 operates as contact pads or bond pads electrically coupled or connected to the circuits on active layer 20. Conductive layer 22 can be formed as contact pads disposed side-by-side a first distance from an edge 24 of component 14, as shown in FIG. 1B. Alternatively, conductive layer 22 can be formed as contact pads that are offset in multiple rows such that a first row of contact pads is disposed a first distance from the edge 24 of the component 14, and a second row of contact pads alternating with the first row is disposed a second distance from the edge 24 of the component 14. In other instances, the component 14 can comprise digital chips, analog chips, or RF chips (or other chips) with more than two rows of bond pads, and may further comprise bond pads 22 over the whole surface of the chip that do not follow a full grid pattern. Other components 14 may have bond pads in an array over the whole surface of the chip.

FIG. 1B also illustrates the semiconductor substrate 10 and components 14 can undergo an optional grinding operation with grinder 29 to reduce a thickness of the semiconductor substrate 10 and component 14.

FIG. 1B further shows one or more optional insulating, passivating, or dielectric layer 26 may be conformally applied over active layer 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having suitable insulating and structural properties. Alternatively, component 14 are packaged without the use of insulating layer 26. In another embodiment, insulating layer 26 includes a passivation layer formed over active layer 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B shows conductive studs 125 can be formed as bumps, thick pads, columns, pillars, posts, or conductive stumps and are disposed over, and coupled or connected to, contact pads 22. The conductive studs 125 can be formed directly on contact pads 22 using patterning and metal deposition processes such as printing, PVD, CVD, sputtering, electrolytic plating, electroless plating, evaporation, or other suitable metal deposition process. Alternately, conductive studs 125 may be formed in a position not vertically over the pads 22 and connected by RDL. Conductive studs 125 can be one or more layers of Al, Ti, TiW, Ta, Cu, Sn, Ni, Au, Ag, palladium (Pd), or other suitable electrically conductive material and can include one or more UBM layers. In an embodiment, a photoresist layer can be deposited over component 14 and contact pads 22. A portion of the photoresist layer can be exposed and removed by a developing or other suitable process. Conductive studs 125 can then be formed as stud bumps, bumps, pillars or other structures as previously described in the removed portion of the photoresist and over contact pads 22 using a plating process. In some embodiments, copper may be used in a plating process. The photoresist layer and other appropriate layers, such as the seed layer, can be removed leaving conductive studs 125 that provide for subsequent mechanical and electrical interconnection and a standoff with respect to active layer 20 and insulating layer 26 if present. In some instances, the conductive studs 125 include a height in a range of 1-100 micrometers (μm), 2-50 μm, or about 25 μm.

In some instances, the conductive studs 125 will be formed as conductive stumps. Conductive stumps 140 are conductive interconnect structures that may have generally vertical sides and be wider than tall. A conductive stump may differ from a pillar or post, each of which may have a height greater than its width. A conductive stump may comprise a cylindrical shape and may further be formed with a cross-sectional area that is circular, oval, octagonal, or as any polygonal or other shape and size. A conductive stump 140 may be used for electrical interconnect, signal transmission, power, ground, or as a dummy thermal conductive stump that is not electrically coupled to an active electrical circuit but is instead thermally coupled to a heat source of an active device to dissipate the heat to another structure, such as to a die pad on a surface of the component 14. The generally vertical sides of a conductive stumps 140 are different from the sides shape that exists for a solder ball or a compressed or outwardly deformed solder ball that has generally rounded sides. The generally vertical nature of a conductive stump 140 comes from being formed in a structure that has been previously developed or etched, such as within openings in a photoresist layer, which will also be generally vertical. Sides of the conductive stump 140 may comprise imperfections or irregularities in shape that result from the etching process, the photoresist material, or other materials and processes used. For example, developing or etching does not generally perfectly or uniformly remove the photoresist within the openings, and therefore forms imperfect, generally vertical openings for deposition of the conductive stump 140. The term "generally vertical" as used herein includes perfectly vertical and imperfectly vertical sides or sides that are about or substantially vertical. A conductive stump 140 is not a wire bond and is not solder.

Figure 1C:
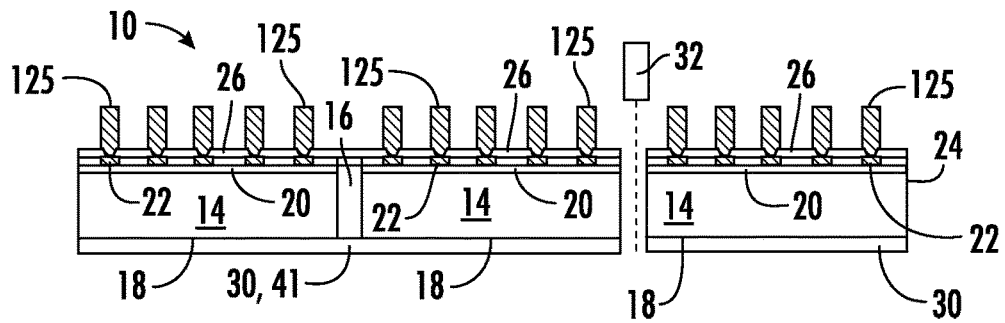

FIG. 1C further illustrates an optional backside material 30 may be attached to the back surface 18 of the component 14, such as for subsequent mounting on a carrier. The optional material 30 may comprise one or more of a thermally conductive backside material, a thermal interface material (TIM), an adhesive, a die (chip or component) attach film (DAF). In other instances, the backside material 30 may be added before being attached to, or disposed over, a temporary carrier 120, as shown in FIG. 2B. In yet other instances, the backside material 30 may be added after encapsulating or molding the components 14, and after removal of the temporary carrier 120, as shown in FIGS. 2T and 2U, or at any other suitable time.

Backside material 30 can be a thermally conductive backside material 30 disposed over a portion or all of the backside of the components 14 and a portion or all of the backside of the package encapsulant 130 as shown, e.g., in FIGS. 2B and 2T. In some instances, the backside material 30 comprises metal, such as copper, or aluminum, or any other one or more layers of metals. The conductive backside material 30 may comprise a thickness in a range of 1,000 to 10,000 Angstroms (for thin applications) or 1-200 μm (for thicker applications). The thermally conductive backside material 30 may also comprise diamond-like carbon (DLC), graphite, carbon nanotubes (CNTs), or other carbon material. One or more of a solderable metal system (SMS), an organic solderability preservative (OSP), or oxidation-resistant metal or metal alloy may be disposed over the conductive pads, flag, and backside material to resist oxidation over at least a portion of the conductive pads. Alternatively, a metal that does not readily oxidize, such as Ni, Ti, W, Cr, Ag, Au, or Pd or a metal that has a thin self-limiting oxide thickness such as Al can be deposited over the thermally conductive backside material 30. The SMS or metal that does not readily oxidize may be formed by, electroplating, electroless plating, immersion plating, physical vapor deposition (PVD), or chemical vapor deposition (CVD) hot dipping or other deposition method of the conductive material over the conductive pads.

In some embodiments an electrical contact such as a metal via or a silicide region is exposed on the backside 18 of the component 14. In other embodiments the backside 18 of the component is not sensitive to an electrically conductive material being present. In both of these cases a metallization process that deposits an electrically conductive metal directly on the backside 18 and any contacts that are present may be used. A deposition typically begins with a barrier layer, an adhesion layer (or a single layer that serves both functions as a barrier and for adhesion may be used) that will adhere both to the backside 18 and the encapsulant and may also serve as a barrier to ion migration into the component substrate. Typical barrier and adhesion metals are Ti, TiN, Ta, TaN, W, Cr, V or alloys thereof deposited by a PVD process. The same PVD process can deposit a thin seed layer of conductive material such as Cu. After the barrier and adhesion layer deposition (and seed layer deposition if there is one) a relatively thick layer of the thermally conductive material 30 can be deposited—such as by electroplating, electroless plating, PVD, CVD, or other suitable process.

In some embodiments it is desirable to have the backside 18 electrically isolated from the thermally conductive backside material 30, wherein an insulating layer may be formed or disposed before the thermally conductive backside material 30 is deposited. The insulating layer may be polyimide or other type of polymer (which may be spun on or otherwise deposited). The insulating material may be an inorganic dielectric that could be thinner than a polymer and also have a higher thermal conductivity—such as silicon oxide, silicon nitride, an oyxnitride, an SiOC material or the like deposited in a CVD-type process. A number of variations of the CVD process may be used, such as plasma-enhanced, ultra-high vacuum, inductively-coupled plasma, or other that all help to achieve a low deposition temperature that is compatible with the encapsulant 130. Another option for the insulator is a spin-on glass (SOG) or a vacuum-deposited polymer. Once such an insulator is deposited then the formation of the thermally conductive backside material 30 can proceed in a similar fashion as described previously.

As previously mentioned, the thermally conductive backside material 30 may comprise diamond-like carbon (DLC), graphite, or carbon nanotubes (CNTs) or other carbon-based material. Alternately the thermally conductive backside material 30 may comprise a metal. The carbon-based materials can be deposited by CVD processes, sol-gel processes or other deposition processes. The metal materials can be deposited by electroplating, electroless plating, immersion plating, PVD, or other method.

FIG. 1C also illustrates wafer 10 can be singulated with a saw or wafer cutting tool 32 into individual components 14 through saw streets 16 using a saw blade or laser cutting tool or a scribe and break process. In some instances, the components 14 will have a thickness (shown in the vertical direction, bottom to top, of the page) of between about 25 µm to about 150 µm for thin ground wafers, or about 100 µm to about 800 µm for thick ground wafers.

Figure 2A:
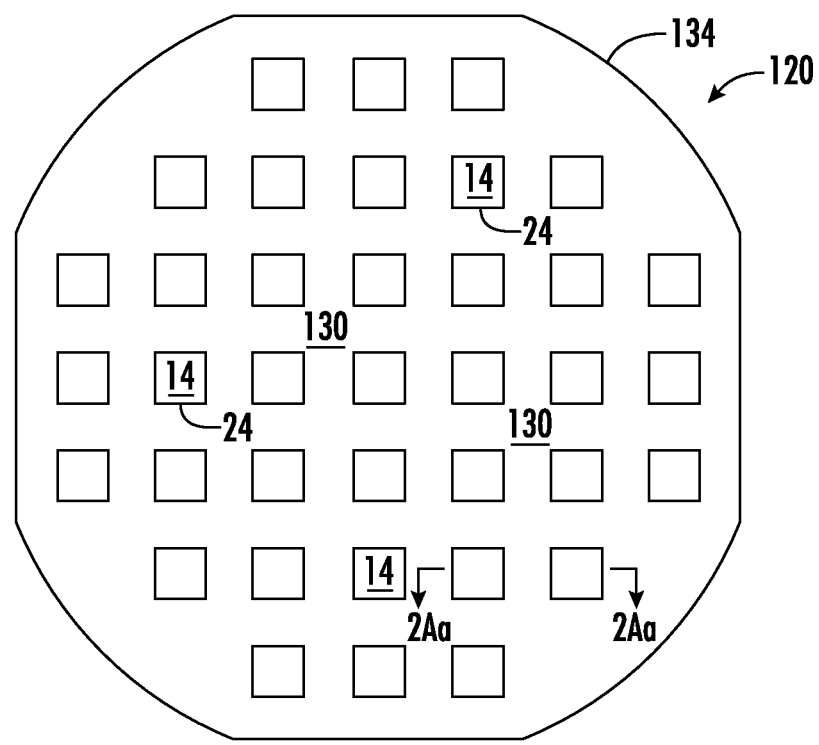
FIGS. 2Aa-2Z illustrate various views in the process of forming molded direct contact interconnect build-up or multi-layer structures comprising the components from FIGS. 1A-1C.
Figure 2A:
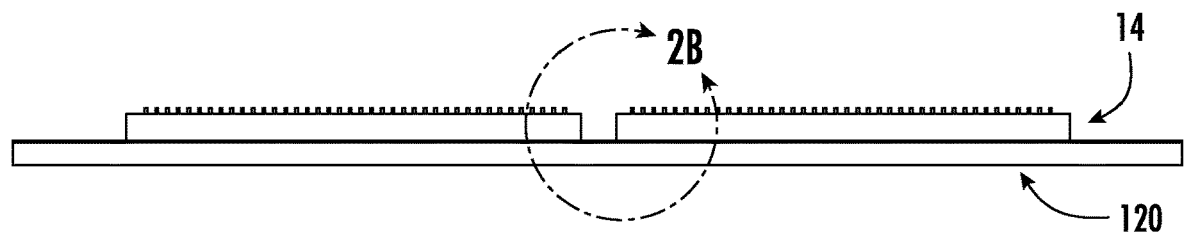
Figure 2B:
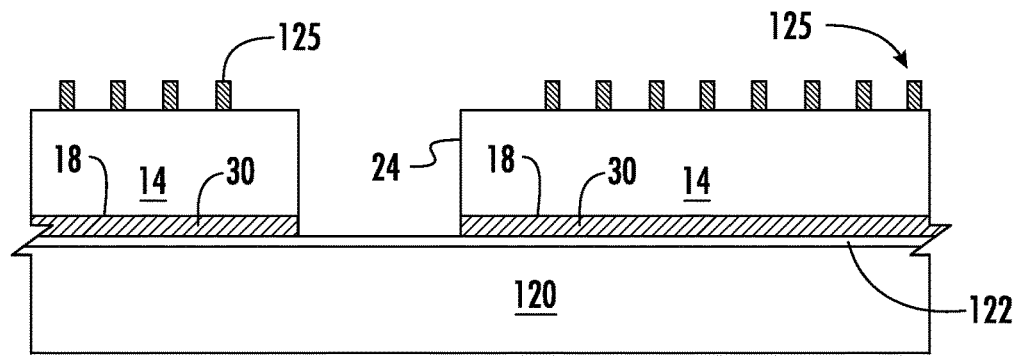

FIG. 2Aa illustrates a cross-sectional side view in which the components 14 (from FIG. 1C) are disposed face up over a temporary carrier 120, the component 14 comprising conductive studs 125 over a surface (such as the active layer 20) of the component 14. The component 14 may be placed adjacent one another, such as in a side-by-side arrangement, and subsequently coupled together. Multiple components 14 may also be processed together at a same time over the temporary carrier 120, such as shown and described with respect to FIG. 2Ab. It will be understood by a person of ordinary skill in the art (POSA), that the close-up views of just portions of the component 14 are shown as representing a small portion of what may be occurring at reconstituted wafer or panel level.

In some instances, the substrate or temporary carrier 120 may be a reusable carrier, a sacrificial carrier, or any suitable carrier that may be a metal carrier, a silicon carrier, a glass carrier, or a carrier made of other suitable material, which may further comprise a release layer. The temporary carrier 120 may be used for the molding or encapsulating process, and then be removed after the encapsulant, such as mold compound, epoxy mold compound (EMC), filled epoxy film such as Ajinomoto Build-Up Film® (ABF)), or other dielectric such as polyimide has been placed, cured, or both, such that the encapsulant provides structural support and the temporary carrier is no longer needed for processing. The components 14 may be placed adjacent one another, such as in a side-by-side arrangement, so that multiple components 14 may be formed at a reconstituted wafer or panel level and processed through various fabrication steps, before being singulated into individual semiconductor assemblies. As such, multiple components 14 may also be processed together at a same time over the temporary carrier, which will be understood by the POSA, even when a close-up view of just portions of the components 14 are shown.

Figure 2C:
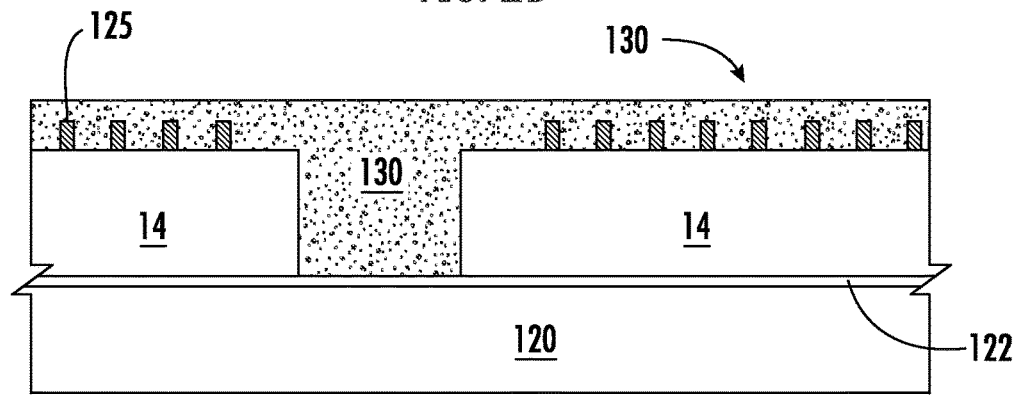

FIG. 2Ab illustrates a plan or top view of the temporary carrier 120, which may comprise a form factor or footprint of a wafer (circular footprint), a panel (square or rectangle), or of any suitable shape (such as generally circular with flat edges), and may comprise a diameter or width of 200-700 mm, such as 330 mm, or of any other suitable size. Components 14 may be disposed over temporary carrier 120 using a pick and place operation, or in any other suitable way. An encapsulant 130 can be deposited around the components 14, including over at least 5 sides of components 14, such as around 4 sides surfaces and over the active layer or first surface 20 or over a backside 18 (as illustrated in FIG. 2C). The encapsulant 130 can be deposited around the plurality of components 14 using a paste printing, compression molding, transfer molding, liquid encapsulant molding, roller lamination (such as for placement of a laminate sheet of ABF), vacuum lamination, spin coating, or other suitable application method. The encapsulant 130 can be a polymer composite material, such as epoxy resin with filler commonly referred to as molding compound or EMC, epoxy acrylate with filler, or other polymer with proper filler. Components 14 can be embedded together in encapsulant 130, which can be non-conductive and environmentally protect the components 14 from external elements and contaminants.

The orientation of components 14, can be either face up with active layer 20 oriented away from carrier 120 to which the components 14 are mounted, or alternatively can be mounted face down with active layer 20 oriented toward the carrier 120 to which the components 14 are mounted. Accordingly, an adhesive 30 can be included or omitted from over back surface 18 of components 14, depending on the process used for encapsulating the components 14 and forming a panel or reconstituted panel 134 comprising components 14 fully molded within encapsulant 42.

The panel 134 can optionally undergo a curing process to cure encapsulant 42. A surface of encapsulant 42 can be substantially coplanar with adhesive 30. Alternatively, encapsulant 42 can be substantially coplanar with backside 18, the encapsulant being exposed by the removal of carrier and interface layer. The reconstituted panel 134 can include a footprint or form factor of any shape and size including circular, rectangular, or square, such as a form factor in a range of 200-700 millimeters (mm), including that of a semiconductor wafer including a circular footprint comprising a diameter of 300 mm. Any other desirable size can also be formed.

FIG. 2B illustrates an enlarged or close-up view of the center of FIG. 2A, illustrating the component 14 face up over an interface or tape 122. The conductive studs 125 (which, e.g., may be formed of copper) may be formed over the active layer 20 and aligned on the components 14. The conductive studs 125 may vary in their orientation and arrangement according to a desired function or design, such as being disposed about a perimeter of the component 14, being formed in multiple rows across the component 14, or by being disposed in an array across the component 14.

The tape 122 resides on the temporary carrier such that the conductive studs 125 are on the opposite face of the component 14 than the temporary carrier 120. FIG. 2B also illustrates thermally conductive backside material 30 may also be disposed over the backside 18 of the component 14. In some instances (e.g., as illustrated in FIGS. 1C and 2B) the backside material 30 may be deposited, formed, or coupled with the backside 18 before the component 14 is mounted to, or disposed over, temporary carrier 120. However, for simplicity and ease of illustration, the backside material is omitted from subsequent FIGs. In other instances, thermally conductive backside material 30 may be added later in manufacturing, such as after the removal of temporary carrier 120, as illustrated, e.g., in FIGS. 2T and 2U.

FIG. 2C, continuing from FIG. 2B, illustrates in a cross-sectional side view disposing an encapsulant 130 around the component 14 face up over an interface layer or tape 122 which resides on a temporary carrier 120 (similar to what was described relative to FIG. 2Ab). The encapsulant 130 is further disposed over four side surfaces of the component 14 (including, e.g., over the active layer of the component 14), and contacting at least a portion of the sides of the conductive studs 125. As used herein, "over" may mean in direct contact with, or with other intervening layers, such as polymer or polyimide layers disposed between the structure and the encapsulant 130. The conductive studs 125 formed over the active layer of the component 14 may be in contact with, surrounded by, encapsulated or molded with a single encapsulant or mold compound at a single step that is the same as the encapsulant disposed around the component 14. The encapsulant 130 can be deposited around the plurality of component 14 using a paste printing, compression molding, transfer molding, liquid encapsulation, roller lamination, vacuum lamination, spin coating, slit or slot chip coating, or other suitable application method. The encapsulant 130 comprises an organic material, a mold compound, or a composite material (such as epoxy resin with filler or epoxy acrylate with filler), and is a material suitable for planarizing or grinding.

Figure 2D:
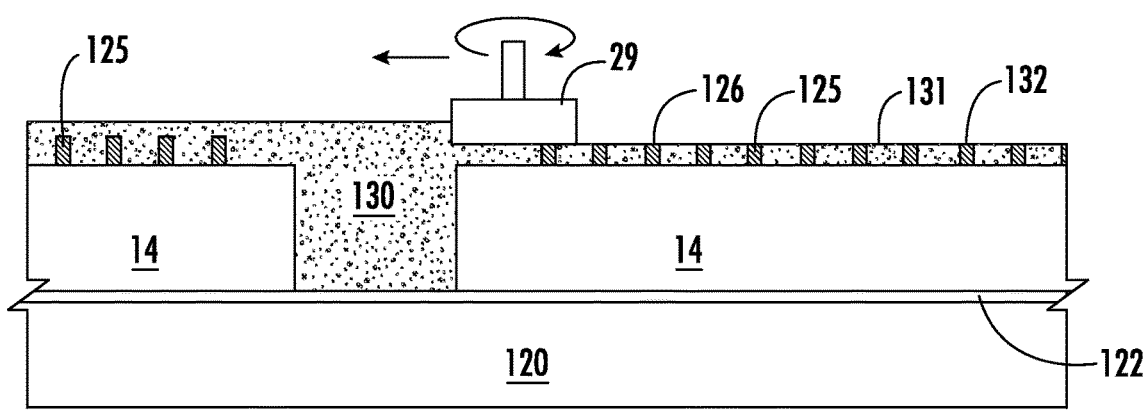

FIG. 2D illustrates one or more of planarizing, grinding, polishing, or CMP the encapsulant 130 over an active layer of the semiconductor dice 14 to create a planar surface 132 comprising exposed ends 126 of the conductive studs 125 and exposed surface 131 of encapsulant 130. The planarization or grinding step with grinder 29 provides a substantially flat surface 132 with exposed ends 126 of conductive studs 125 or other interconnects. As used herein, "flatness" is defined as the variation of wafer thickness relative to a reference plane. The planarizing or grinding of the encapsulant produces a flatness comprising a total roughness height from peak to valley measured of less 500 nm, less than 350 nm, less than 250 nm, less than 200 nm, or less than 100 nm over a characteristic measurement distance. The characteristic measurement distance is defined by the ISO 4288 standard, an entirety of which is hereby incorporated by reference. The characteristic measurement distance may also be a distance great enough to characterize the roughness, such as to a generally accepted level of certainty, and in some instances could be a distance of three times the distance of the roughness. While conventional encapsulant grinding might be done with less flatness, greater accuracy and precision can be obtained by using integrated sensors such as laser, acoustic, or other non-contact methods to control the grinding resulting in better flatness. In some instances, the conductive studs 125 are disposed over the active layer 20 of the component 14, and may be formed with a height of less than or equal to about 50 µm or less than or equal to about 250 µm, and then be ground down to a height of less than its original height, such as, in a particular embodiment, may be formed with a height of less than or equal to about 10 µm or less than or equal to about 5 µm, and then be ground down to a height of less than or equal to about 4 µm, 2 µm, or 1 µm. As used herein, "about" or "substantially" means a percent difference less than or equal to 50% difference, 40% difference, 30% difference, 20% difference, 10% difference, or 5% difference.

Figure 2E:
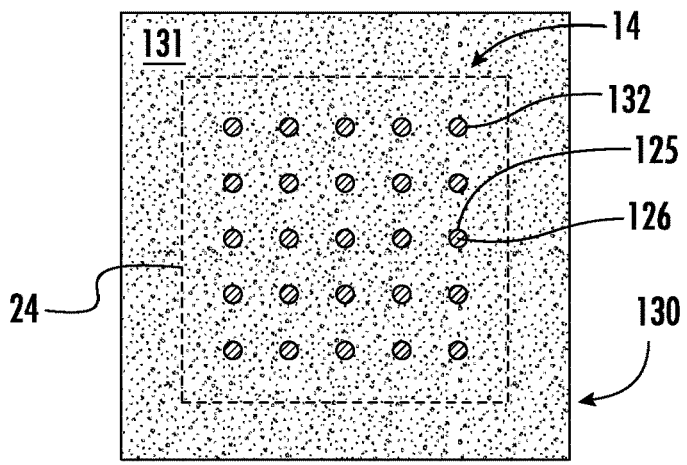

FIG. 2E illustrates a top or plan view of one molded component 14 with exposed ends 126 of the conductive studs 125. A substantially planar surface 132 may be disposed over the first surface 20 of the component 14. The substantially planar surface 132 may comprises ends 126 of the conductive studs 125 and a planar surface 131 of the first encapsulant layer 130. The planar surface of the first encapsulant comprises a roughness less than 500 nm over a characteristic measurement distance, as described above. The exposed ends 126 of the conductive studs 125 may be coplanar, substantially planar, or flat with the planar surface 131 of the encapsulant 130, such as after the grinding with grinder 29. In some instances, portions of, or residue from, the conductive material of the conductive studs 125 can be mixed with, deposited on, or spread across the first layer of encapsulant 130. In such instances, an etching process may be performed to remove the residue. The etching process may also recess the exposed ends 126 of the conductive studs 125 to create new lower exposed ends 126 that are recessed below the planar surface 131 of the first encapsulant layer 130 by a distance of 10 µm or less, 5 µm or less, 2 µm or less, or 1 µm or less. Thus, the substantially planar surface 132 may comprise the planar surface 131 of the encapsulant 130 offset from the recessed exposed ends 126 of the conductive interconnects 125. In some embodiments the grinding and etching process may be combined in what is known as a Chemical Mechanical Polishing or CMP process.

Figure 2F:
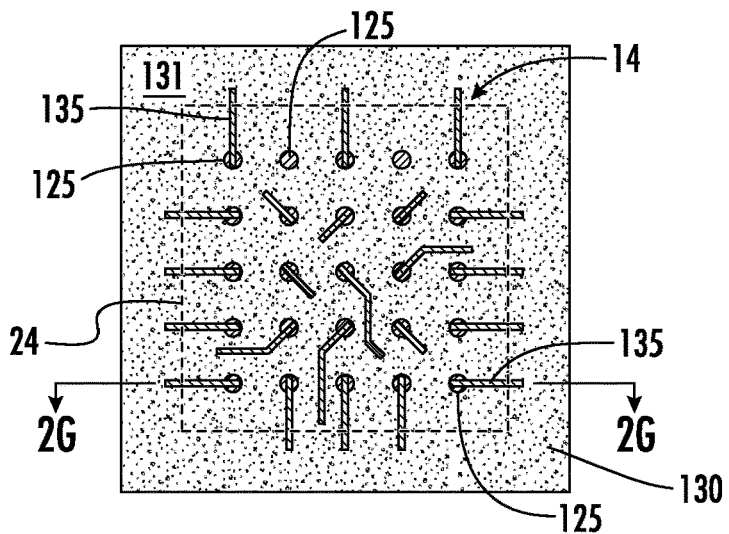

FIG. 2F, continuing from FIG. 2E, illustrates a top or plan view of one of the components from FIG. 2E, with a first conductive layer 135 formed over the planar surface 132, over the exposed surface of encapsulant 131, and connecting to exposed ends 126 of conductive studs 125. Portions of the first conductive layer 135 may be disposed over the active layer 20 of the component 14, and other portions of the first conductive layer 135 (including features such as traces) may extend beyond the edge 24 of the component 14.

Figure 2G:
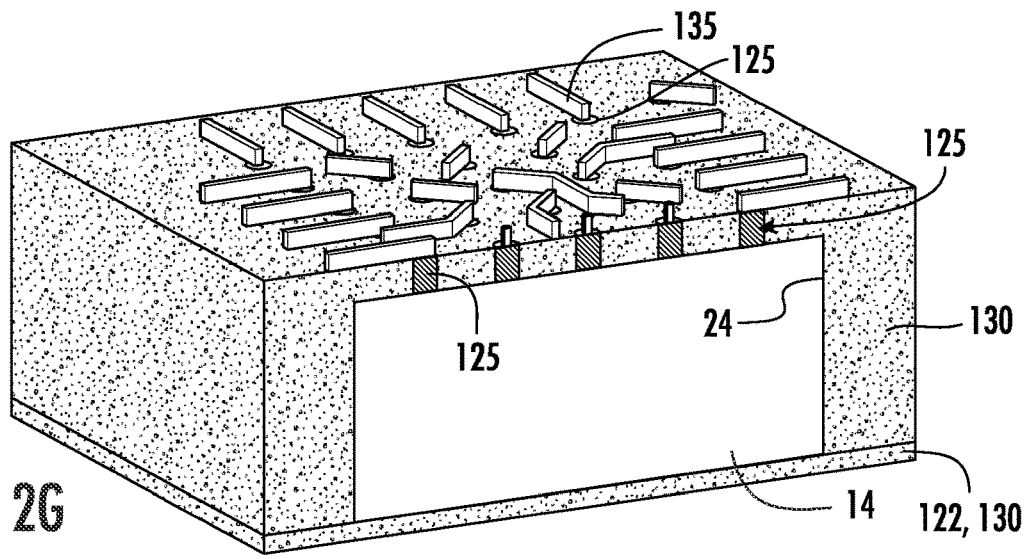

FIG. 2G, continuing from FIG. 2F, presents a perspective view of a portion of an interconnect build-up or multi-layer structure 186 wherein first conductive elements 146 are disposed or formed over the first encapsulant layer 130 and configured to be electrically coupled with the conductive studs 125 of the component 14. The first conductive elements 146 comprise one or more of first conductive stumps 140 and first conductive layer 135. First conductive layer 135 comprises one or more of a RDL, trace, or contact pad. As such, in some instances the first conductive elements 146 may comprise conductive stumps 140 without an RDL or contact pads. In other instances, the first conductive elements 146 may comprise first conductive layer 135 (such as an RDL) without conductive stumps 140. In yet other instances, the first conductive elements 146 comprise both first conductive stumps 140 and first conductive layer 135, such as RDL. First conductive elements 146 may be formed by plating or other suitable process, so as to be configured to be electrically coupled to the conductive studs 125 and the active layer 20 of the component 14. The formation of first conductive elements 146 is described in greater detail below with respect to FIG. 2H.

Figure 2H:
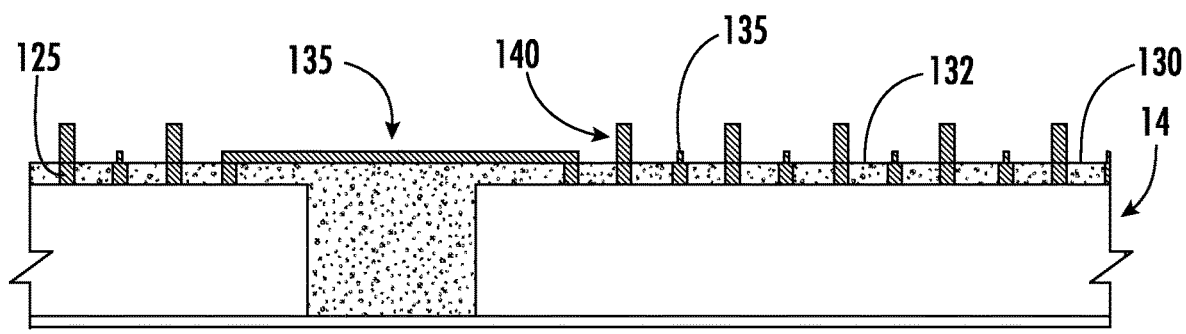

FIG. 2H, continuing from FIG. 2D, illustrates a cross-sectional side view of forming a first conductive layer 135 and first conductive stumps 140 formed or disposed over the component 14 and the encapsulant 130. The processes described with respect to the cross-sectional views in FIGS. 2A-2D and those described with respect to those described in the plan and perspective views of FIGS. 2E-2F are similar or identical and can each apply to semiconductor assemblies that comprise a single component 14, or multiple components 14. For convenience and ease of illustration the perspective and plan views are illustrated with respect to a single component 14, but as will be appreciated by a POSA, also apply to the cross-sectional views in FIGS. 2A-2D in which multiple components 14 are shown included within a final electronic assembly.

Returning now to FIG. 2H, the first conductive layer 135 and first conductive stumps 140 are shown formed over the encapsulant 130, such as on the planar surface 132, and configured to be electrically coupled with the conductive studs 125 of the component 14. The first conductive layer 135 and first conductive stumps 140 may be formed using PVD, CVD, electrolytic plating, electroless plating, or other suitable metal deposition process. The first conductive layer 135 and first conductive stumps 140 may be one or more layers of copper (Cu), aluminum (Al), tin (Sn), nickel (Ni), gold (Au), silver (Ag), titanium (Ti), Platinum (Pt), Tungsten (W) or other suitable electrically conductive material.

FIGS. 2F and 2H further illustrate the first conductive layer 135 can be formed as one or more traces or as an RDL comprising a trace line and space of less than or equal to 2 μm for a pitch of less than or equal to 4 μm, or in other instances comprising line and space of less than or equal to 5 μm for a pitch of less than or equal to 10 μm. As such, the pitch of the traces may be much smaller than a pitch of the conductive studs 125 (or of conductive stumps 140). Larger pitches and less dense connections are also possible. In some instances, as e.g., for a QFN, a pitch of 500 μm or less may be used, and traces may comprise a width of 100 μm or less or 50 μm or less, or 40 μm or less. The first conductive layer 135 or traces may also be formed so as to directly contact the encapsulant 130 and the conductive studs 125 without capture pads.

The first conductive stumps 140 may also be formed at a same time as the first conductive layer 135 (such as with a single plating process) or at a second time after the forming of the conductive layer 135 (such as with a dual plating process, also referred to as a two-plate process). In both the single plating process, and the dual plating process, a seed layer may be formed. The seed layer may be of Ti followed by Cu, TiW followed by Cu, or a coupling agent followed by Cu. The seed layer may be deposited by sputtering, electroless plating, or by depositing laminated Cu foil combined with electroless plating. In some embodiments, the seed layer may additionally comprise one or more of a wetting layer, a barrier layer, and an adhesive layer bonded to the encapsulant 130, the conductive layer 135, or both.

When performing the single plating process, a first photoresist or resist layer for the conductive layer 135 (or RDL) may then be formed and patterned over the seed layer so as to form openings in which the conductive layer 135 may be subsequently formed. A second photoresist or resist layer may be formed and patterned for the first conductive stumps 140 (or studs) or other conductive pattern before the formation of the conductive layer 135. The second photoresist may be formed by tenting over the first photoresist layer such that the second photoresist does not extend into, or occupy, the openings in the first photoresist formed for the conductive layer 135. Plating the conductive layer 135 and the first conductive stumps 140 may then be performed simultaneously to two different heights with plating fluid extending into the open spaces (enclosed tunnels) in the photoresist and below the second photoresist. The above plating may be performed or operate in a fashion similar to the plating of high aspect ratio through silicon vias (HAR TSVs). After the plating of the conductive layer 135 and the first conductive stumps 140, the first photoresist and the second photoresist may be stripped or removed. After removal of the photoresist layers, exposed portions of the seed layer (e.g., those not under or covered by the conductive layer 135 and the first conductive stumps 140), can be removed, such as by etching.

When performing the dual plating process, after forming the seed layer, a first photoresist or resist layer is formed. The first photoresist is formed and patterned to create openings in the first photoresist layer, in which the conductive layer 135 may be formed. The conductive layer 135 may then be formed, such as by plating, within the openings in the first photoresist layer. The first photoresist may then be removed before placement of the second photoresist, or alternatively, may remain while the second photoresist is placed and then be removed together with, or at a same time as, the second photoresist. In either event, after forming conductive layer 135, a second photoresist or resist layer may be formed or patterned to form openings in the second photoresist layer for the conductive contacts 140. The first conductive stumps 140 may then be formed, such as by a plating process. After formation of the conductive contacts 140, the second photoresist layer (and the first photoresist layer if still present) may be removed, such as by stripping. After removal of the photoresist layers, exposed portions of the seed layer (e.g., those not under or covered by the conductive layer 135 and the first conductive stumps 140), can be removed, such as by etching. Additional alternate flows are also possible to achieve the desired plated structure.

Figure 2I:
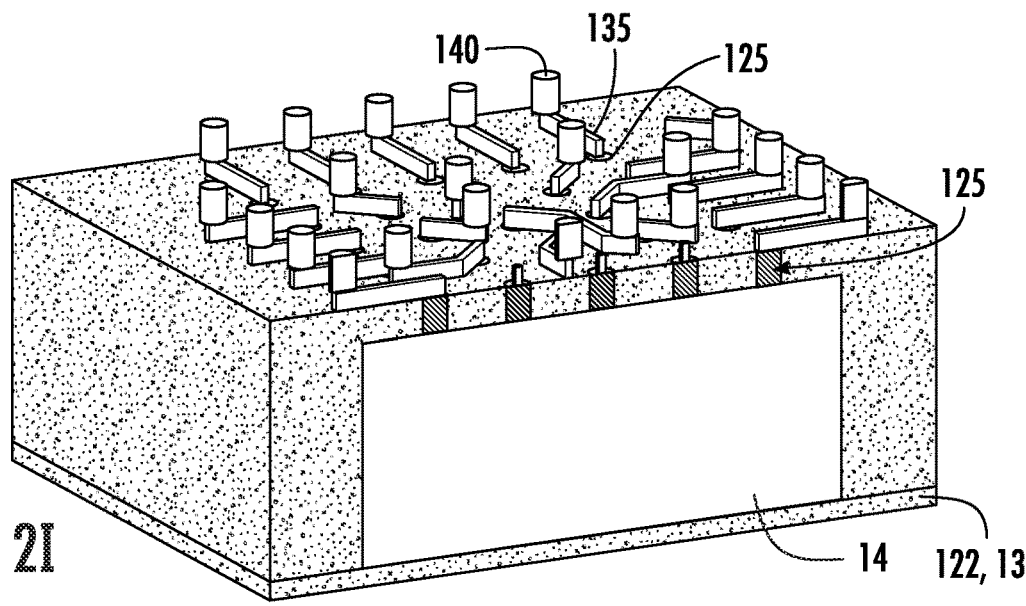
Figure 2J:
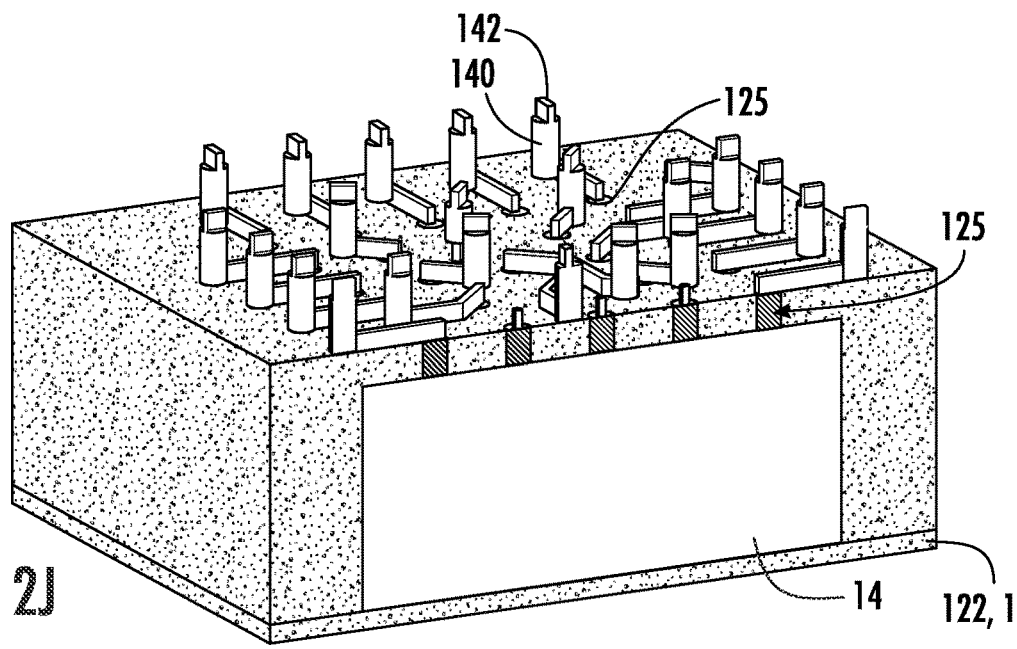

FIG. 2I shows a perspective view of an interconnect build-up or multi-layer structure 186 (or a portion thereof) where the first conductive stumps 140 are formed on the first conductive layers 135 using the single plating process method, as described above.

FIG. J shows a perspective view of an interconnect build-up or multi-layer structure 186 (or a portion thereof) where the first conductive stumps 140 are formed on the first conductive layers 135 using the dual plating process method.

Figure 2K:
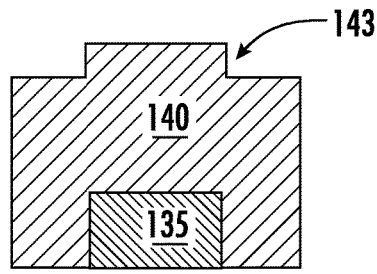
Figure 2K:
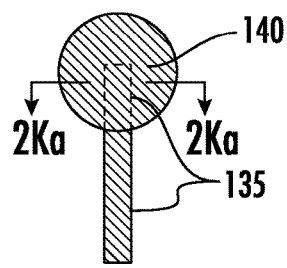

FIGS. 2Ka and 2Kb, illustrate various views of an example of a topography of an upper surface 143 of a conductive stump 140 that may result from a plating process where the conductive stump 140 is plated over the first conductive layer 135 or trace. More specifically, FIG. 2Ka illustrates a cross-sectional side view, and FIG. 2Kb illustrates a plan view of the conductive stump 140 and the conductive layer 135. As illustrated, the upper surface 143 of the conductive stump 140 may be roughly the same as that of the conductive layer or trace 135 over which it is plated. The non-planar topography of the upper portion 143 of the conductive stumps 140 may follow the non-plan contours over which it is formed, especially when a physical vapor deposition (PVD) process is used. In other instances, the formation or build-up of the conductive stump 140 may be self-leveling and demonstrate smaller contours or surface variation 143 than the surface over which it is formed. In instances where upper surface contours or topography of the upper surface 143 of the conductive stump 140 are larger than desired, the tapered shape 143 may be planarized in a subsequent grinding step.

Figure 2L:
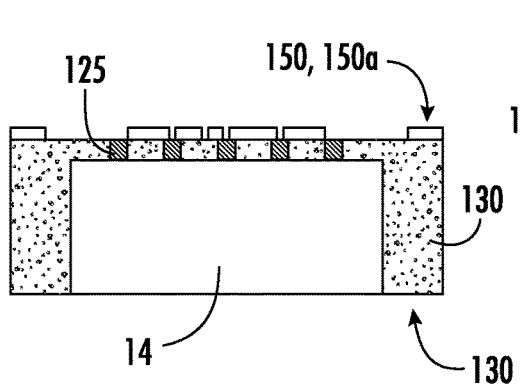
Figure 2L:
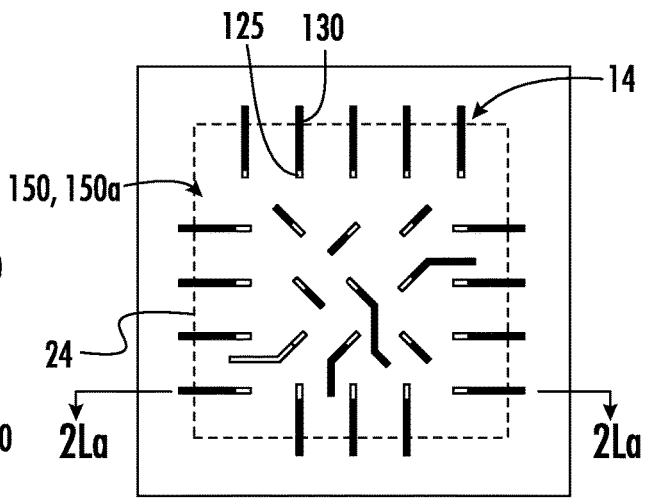

In a single or dual plate method or process the following steps or features may be present: (i) form a conductive seed layer (wherein the same seed is used in both plating processes), (ii) form photo resist layer 150 a first resist layer 150a for the conductive layer 135 (RDL), and (iii) plate the conductive layer, as illustrated in FIGS. 2La and 2Lb. FIG. 2La illustrates a cross-sectional side view, and FIG. 2Lb illustrates a plan view. In FIG. 2Lb the encapsulant 130 is shown in black and conductive studs 125 are shown in white.

Figure 2M:
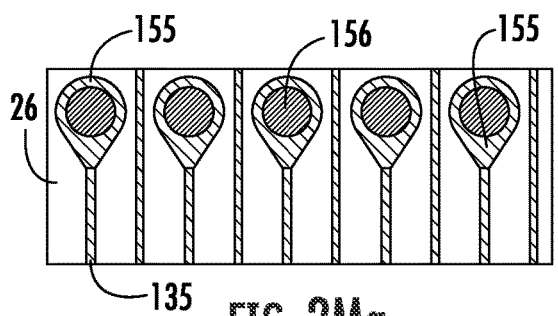
Figure 2M:
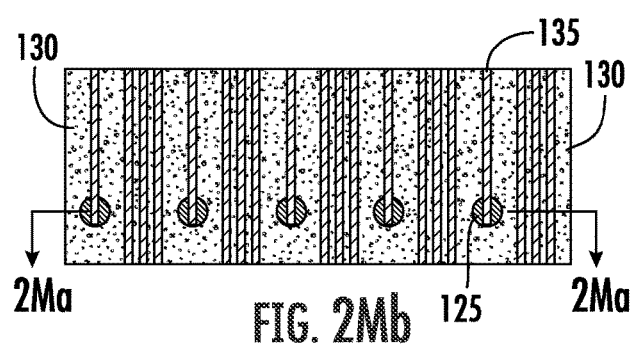

FIGS. 2Ma and 2Mb illustrate that a difference between the routing and interconnects that are available in the instant disclosure (FIG. 2Mb) versus the structures known the art (FIG. 2Mb) in which the presence of large conventional contact pads 155 require a greater pitch or spacing of traces 135 versus the compact structures shown in FIG. 2Mb that omit conventional contact pads 155. The large conventional contact pads 155 are used to allow for significant tolerance in making contacts between contact pads 155 and connecting elements 156. A deformable insulting or passivating layer 26, such as a polymer or polyimide that typically does not support grinding, is used in construction of conventional devices to assist in making connections between elements using the contact pads 155 (see FIG. 2Ma). With the structures of the instant disclosure, scanning and software can be used to make adjustments in the patterning process that avoid the need for large conventional contact pads 155. In some embodiments, design software may adjust an x-y position or rotation of the patterned features (including traces 135). The design software may create the unit-specific pattern design by selecting from a discrete number of design options or dynamically generating the unit-specific pattern. Note, for example, that FIG. 2Mb shows multiple traces 135 (e.g. 3 traces) between the traces 135 that are coupled with the conductive studs 125. On the other hand, FIG. 2Ma shows just one trace 135 that is routed between the traces 135 coupled with capture pads 155, in order to provide clearance and spacing among the traces 135 and the capture pads 155, which produces less routing density. By using unit specific patterning, capture pads 155 may be removed and smaller or tighter pitches may be used for the traces 135, thereby increasing routing density.

Figure 2N:
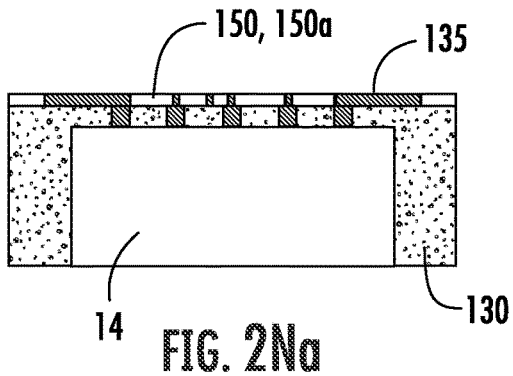
Figure 2N:
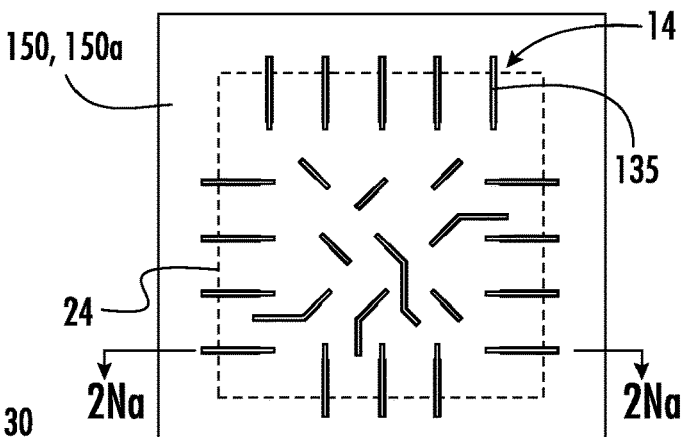

FIGS. 2Na and 2Nb illustrate various views of plating the conductive layer 135 coupled to the conductive studs 125 and the component 14, while also being disposed over the encapsulant 130. FIG. 2Na illustrates a cross-sectional side view, and FIG. 2Nb illustrates a corresponding plan view, with the section line 2Na in FIG. 2Nb indicating the relationship between FIGS. 2Na and 2Nb.

Figure 2O:
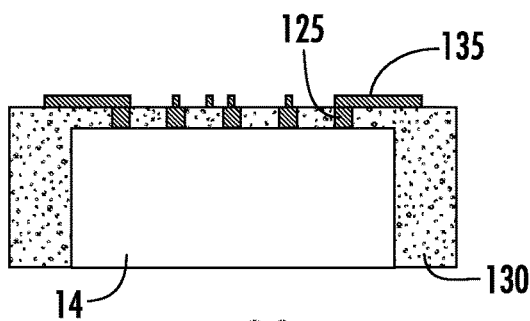
Figure 2O:
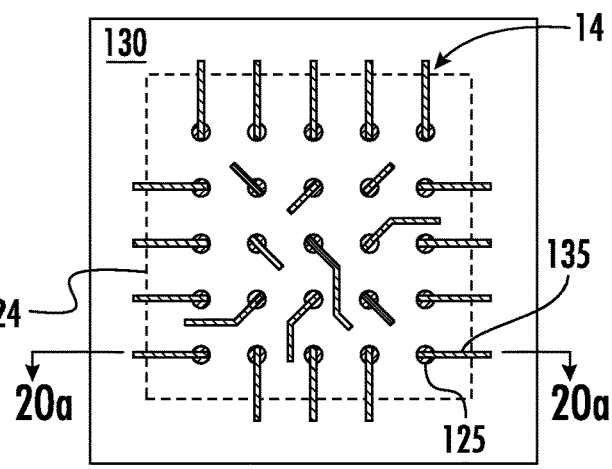

FIGS. 2O*a* and 2O*b* further illustrate the removal or stripping the resist 150 or first resist 150*a* after the first plating step of the two plate process to form the patterned structure from the conductive layer 135. The conductive layer 135 is shown coupled to the conductive studs 125 and the component 14, while also being disposed over the encapsulant 130 and over the active layer 20 of the component 14. FIG. 2O*a* illustrates a cross-sectional side view, and FIG. 2O*b* illustrates a corresponding plan view, with the section line 2O*a* in FIG. 2O*b* indicating the relationship between FIGS. 2O*a* and 2O*b*.

Figure 2P:
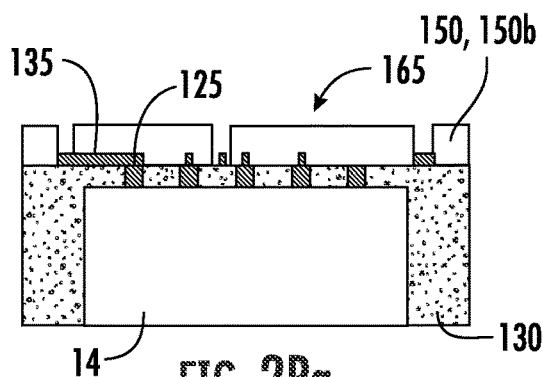
Figure 2P:
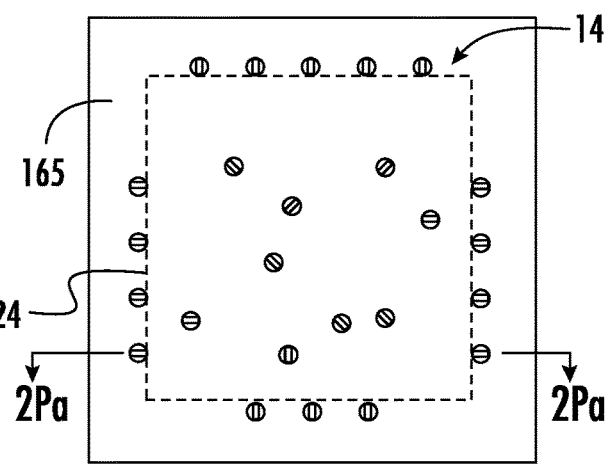

FIGS. 2P*a* and 2P*b* illustrate forming and patterning the second resist or photo resist layer 150*b* for the first conductive stumps 140 (studs) as part of the two plate process. FIG. 2P*a* illustrates a cross-sectional side view, and FIG. 2P*b* illustrates a corresponding plan view, with the section line 2P*a* in FIG. 2P*b* indicating the relationship between FIGS. 2P*a* and 2P*b*.

Figure 2Q:
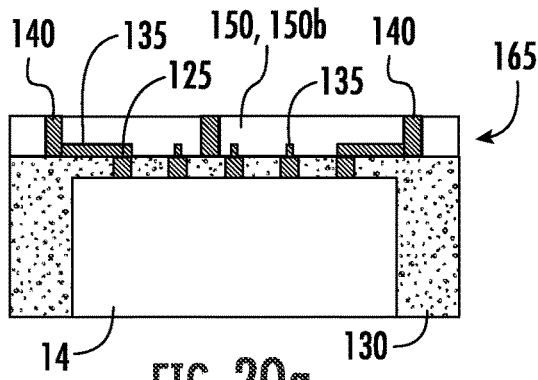
Figure 2Q:
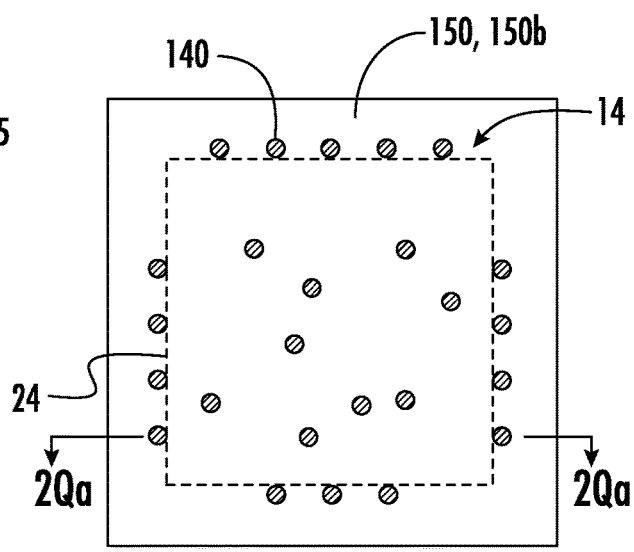

FIGS. 2Q*a* and. 2Q*b* illustrate the first vertical contacts 140 plated, with a number of the first vertical contacts 140 being plated, and residing, on top of conductive layer 135 for subsequent electrical or signal connection. In other instances, first vertical contacts 140 may not be coupled to traces 135, and may be coupled instead to other portions of the conductive layer 135 or to the component 14, such as for thermal performance or heat transfer and for cooling of component 14. FIG. 2Q*a* illustrates a cross-sectional side view, and FIG. 2Q*b* illustrates a corresponding plan view, with the section line 2Q*a* in FIG. 2Q*b* indicating the relationship between FIGS. 2Q*a* and 2Q*b*.

Figure 2R:
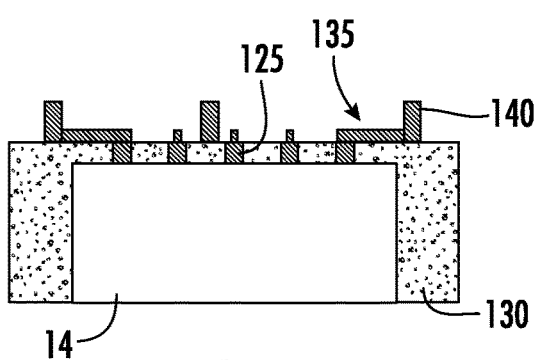
Figure 2R:
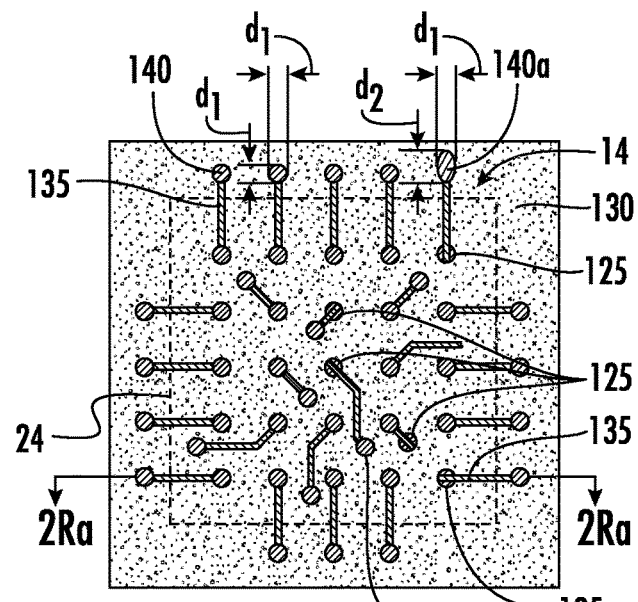

FIGS. 2R*a* and. 2R*b* illustrate the second resist 150*b* may be removed or stripped, and the seed layer may be removed or etched. FIG. 2R*a* illustrates a cross-sectional side view, and FIG. 2R*b* illustrates a corresponding plan view, with the section line 2R*a* in FIG. 2R*b* indicating the relationship between FIGS. 2R*a* and 2R*b*. The conductive stumps 140 may be formed with a diameter or cross-sectional width in a first direction less than or equal to about 12 µm, or less than or equal to about 5 µm and at a pitch in the first direction of less than or equal to about 25 µm or less than or about 10 µm. In some instances, the conductive stumps 140 may be circular and symmetrical in every direction, while in other instances the conductive stumps 140 may not be circular, may be oblong and may be asymmetrical or symmetrical in less than all directions (see e.g. oblong conductive stump 140*a* in FIG. 2Rb). Oblong conductive stumps 140*a* provide for smaller pitch or first distance d1 in a first direction and a larger distance d2 in a second direction, which results in greater stability and robustness against stress and strain during manufacturing (such as grinding) as well as during assembly use (including thermal cycling, drop tests, and other use) than if just the smaller distance d1 were used in every direction for the conductive stump 140. Thus, oblong conductive stumps 140*a* may comprise a minimum width or distance in a first direction, and a larger width or distance in other directions, such as directions that do not impact, or minimally impact, a desired pitch or spacing. The first conductive layer 135 may comprise a RDL (or other feature without redistribution) with a line and space width of 2 µm or smaller. Greater pitches may also be used.

The first conductive stumps 140 may take the place of a via 156 and a conventional capture pad 155 allowing much higher density interconnect pitch and providing vertical interconnection between stacked layers of conductive layers alternately formed with stacked layers of encapsulant as part of a multi-layer interconnect 186. FIG. 2Sa shows an enlarged plan view of vertically offset traces connected through a via 156 and a conventional capture pad 155, with the dotted line of trace 135*a* indicating the lower trace 135*a* is vertically separated from trace 135*b* and is on a lower interconnect level (and under dielectric). FIG. 2Sb shows the new structure without a capture pad, with vertically offset traces 135*a* and 135*b* being coupled by a much smaller first conductive stumps 140 with the dotted line of trace 135*a* indicating the lower trace 135*a* is vertically separated from trace 135*b* and is on a lower interconnect level (and under encapsulant 130).

The first conductive stumps 140 comprise a cross-sectional area, as seen in top view or plan view, that may be circular, square, oval, octagonal, or any other polygonal or desirable shape. The diameter—or greatest width—of the cross-sectional area of the first (or any subsequent) conductive stumps 140 (regardless of whether the cross-sectional area is circular or not) may be less than or equal to 8 µm. The first conductive stumps 140 may be at a pitch of less than or equal to 20 µm, which provides for greater routing density that what has been available with the prior art and with using capture pads 155. As desired greater pitches and cross-sectional areas may also be used.

FIG. 2T provides a cross-sectional profile view, similar to the views of FIGS. 2B-2D and 2H, that illustrate a portion of an electronic assembly or final package 200 comprising multiple components 14. More specifically, FIG. 2T illustrates disposing a second encapsulant layer 175 over the first conductive layer 135 and first conductive stumps 140. The second encapsulant layer 175 may be similar, identical, or different than the first encapsulant layer. FIG. 2T also illustrates that after molding the second encapsulant layer 175, the temporary carrier 120 may be removed, and a backside or back surface of the components 14 (or a backside material 30 when present) may be exposed from the encapsulant 130.

Figure 2V:
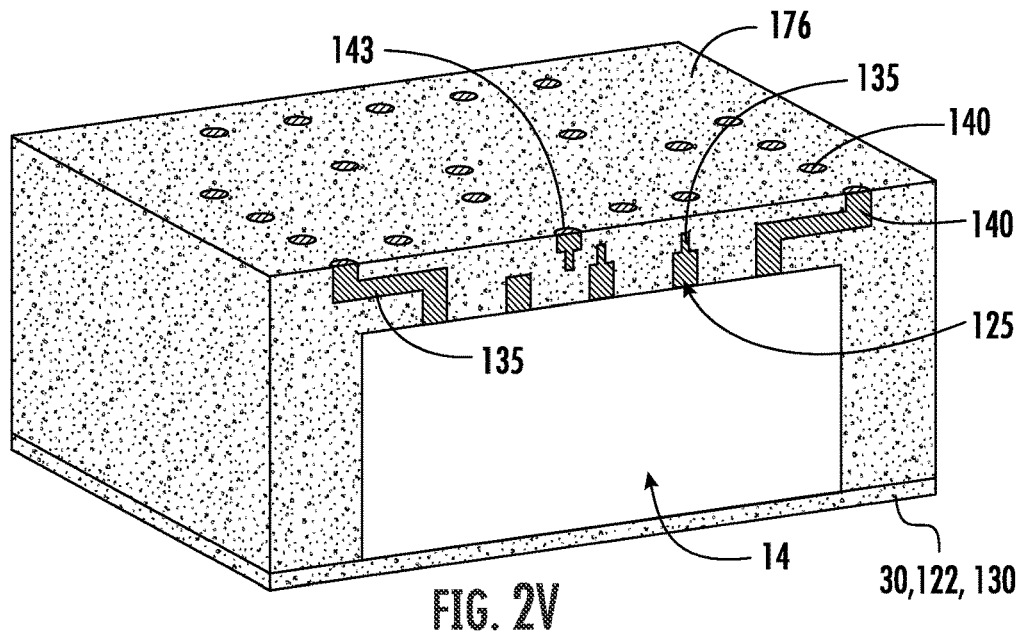
Figure 2W:
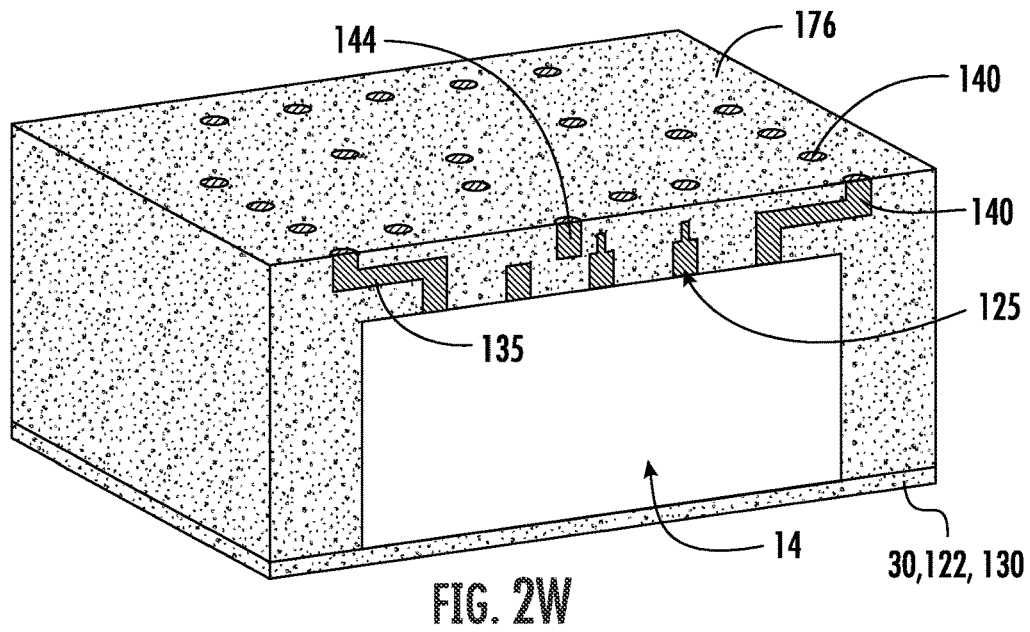

FIG. 2U illustrates a cross-sectional side view of grinding the first conductive stumps 140 and the second layer of encapsulant 175 with grinder 29 to form a second planar surface 176. FIG. 2V and FIG. 2W illustrate isometric views of the structure after the molding and a front grind process. More specifically, encapsulant layer 175 can be the same or similar to the first encapsulant layer 130, and the second encapsulant layer 175 will support grinding, as will the second conductive stumps 140, that can undergo one or more of a planarizing, grinding, polishing, or CMP process to form a second planar surface 176. The second planar surface 176 comprises both second encapsulant 175 and exposed ends 141 of the conductive stumps 140. The planarizing or grinding of the second encapsulant 175 produces a flatness comprising a total roughness height from peak to valley measured of less 500 nm, less than 350 nm, less than 250 nm, less than 200 nm, or less than 100 nm over a characteristic measurement distance. FIG. 2V illustrates the structure when the plating is performed in a one step process. FIG. 2W illustrates the structure when the plating is performed in two steps.

Figure 2X:
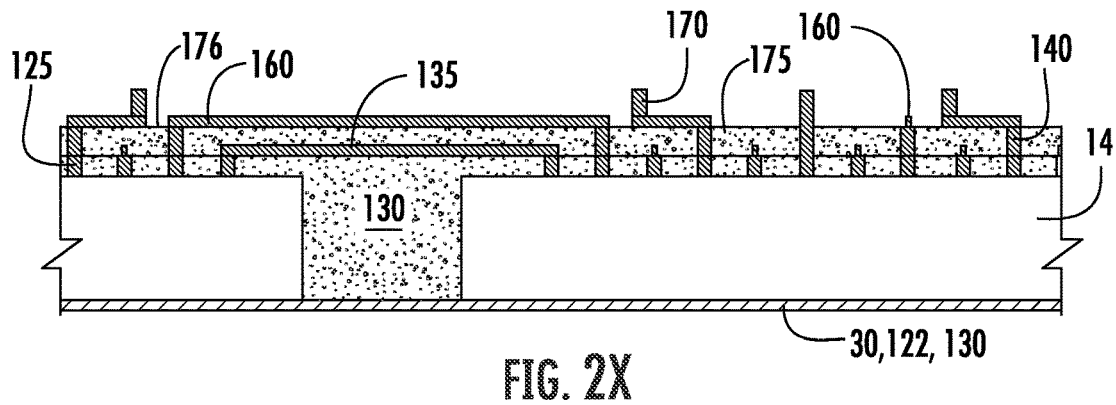

FIG. 2X, continuing from FIG. 2U, provides another cross-sectional side view that illustrates forming a second conductive layer or traces 160 and second conductive stumps 170 disposed over the second encapsulant layer 175 and configured to electrically coupled with the first conductive layer 135 and first conductive stumps 140. A POSA will understand the second conductive layer 160 and the second conductive stumps 170 can be formed as described above with respect to the first conductive layer 135 and the first conductive stumps 140 (and as shown and discussed, e.g., with respect to FIGS. 2F-2T). In some embodiments, the second conductive layer 160 may contact the first conductive stumps 140. In certain embodiments, first conductive layer 135, second conductive layer 160, or both, may connect from one component 14 to another component 14, such as for an electronic assembly comprising more than one component included therein.

Figure 2Y:
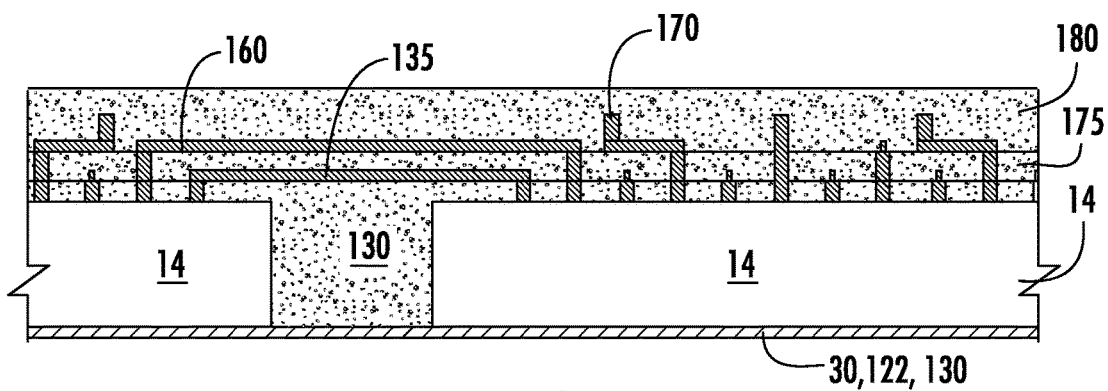

FIG. 2Y illustrates disposing a third encapsulant layer 180 over the second conductive layer 160 and second conductive stumps 170. Next, there may be grinding of the second conductive stumps 170 and the third encapsulant layer 180 with a grinder 29 to form a third planar surface, which may operate for the third encapsulant layer 180 as it was described above with respect to the second encapsulant layer 175. In a fashion similar to what has been described above, alternating layers of additional conductive layers and conductive stumps, together with alternating layers of encapsulant, may be formed up to 12 layers of conductive layers and conductive stumps, or to any desirable number of layers.

Figure 2Z:
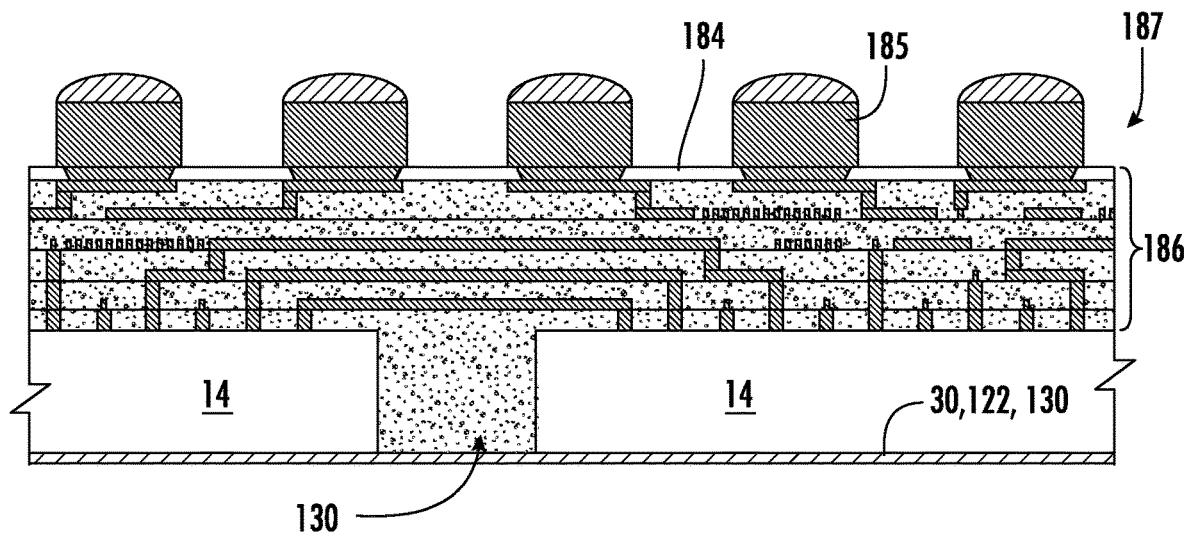

FIG. 2Z, continuing from FIG. 2Y, illustrates a cross-sectional side view of forming additional conductive layers, conductive stumps, and layers of encapsulant that may provide for additional signal routing, heat transfer, and other desired functionality, as described below, e.g., with respect to FIG. 4A. After forming a desired number of conductive layers, conductive stumps, and layers of encapsulant the following additional layers or structures may be added: (i) an insulating or passivation layer 184 (similar or different than layer 26) that may comprise one or more layers of polyimide, polymer, or inorganic dielectric, and (ii) a conductive contacts 185, wherein the conductive contacts are configured to be electrically coupled through one or more of the conductive stumps to one or more components 14. The conductive contacts 185 may comprise one or more of: IO electrical contacts, power or ground electrical contacts, clock contacts, a bump, a solder ball, a solder bump, a BGA, copper pillars, and copper pillars with solder, conductive polymer bumps, and nickel bumps to couple with devices outside the electronic assembly or package. In other cases, there may be LGA pads or contact pads provided to couple with devices outside the electronic assembly or package.

Figure 3:
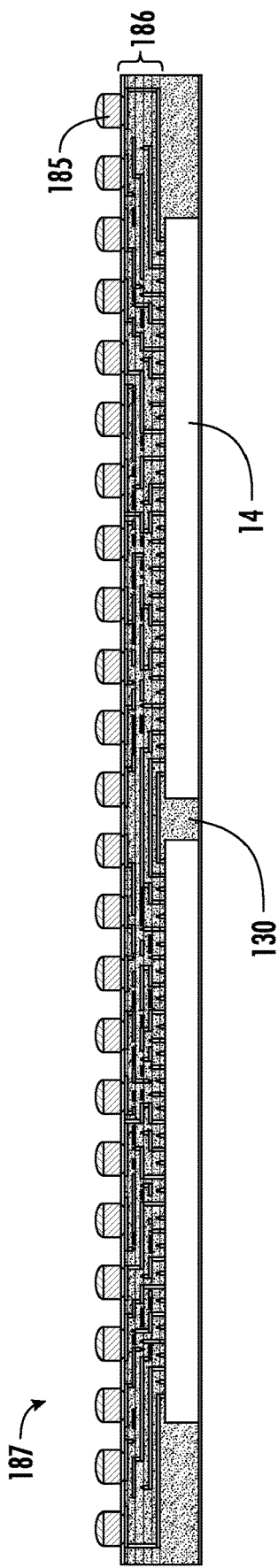
FIG. 3 illustrates an embodiment of an electronic assembly comprising multiple components and a molded direct contact interconnect build-up or multi-layer structure disposed over the component.

FIG. 3 illustrates a zoomed out view of an electronic assembly, semiconductor assembly, or final structure 187 comprising a molded build-up or multi-layer interconnect structure 186 shown in close-up in FIG. 2Z. By forming molded direct contact interconnect build-up or multi-layer structures 186 with encapsulant as described herein, rather than polymers such as polyimide, significant cost savings may be achieved. A cost of conventional packaging of a component may have roughly half of its cost associated with, or driven by, roughly 10 materials. The most expensive material can be polyimide, accounting for 10-20% of total package cost. The encapsulant, such as is used in place of the polyimide for the molded direct contact interconnect build-up or multi-layer structures 186 is much less expensive than the polyimide, accounting for roughly 1-2% of total package cost. Thus, the molded direct contact interconnect build-up or multi-layer structures 126 with encapsulant 130, 175, etc. may be roughly five times (5×) to ten times (10× cheaper, or about one-fifth to one-tenth the cost for using encapsulant rather than polyimide.

Figure 4A:
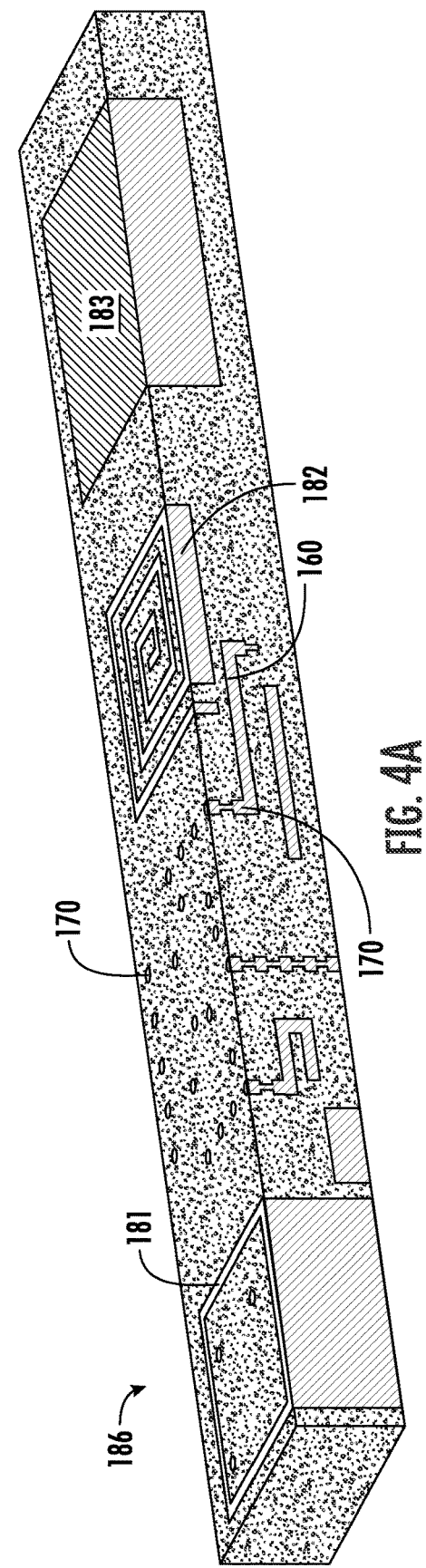

FIGS. 4A-4C illustrate isometric views of a part or portion of the molded build-up or multi-layer interconnect structure 186. FIGS. 4A and 4B illustrate how various shapes or features may be formed or plated across multiple layers of the multi-layer interconnect structure 186, including (moving from left to right): (i) a box shield 181 (for shielding interference and undesired RF or EM signals), as shown in the left of the figure, (ii) conductive stumps 170 stacked and interconnecting with or without routing or RDLs 160, (iii) an inductor 182, and (iv) on the right of the figure a power delivery or thermal dissipation structure 183.

In some instances, the electronic assembly may comprise multiple layered structures, which may comprise one or more of a stripline routing layer, a power plane pair, microstrip routing layers, power and ground planes, waveguides, and other desirable features. Stripline arrangements may include a trace for carrying a signal (S) is formed on a surface layer of a structure and is vertically separated or offset from ground ("GND" or "G"). The signal line may be formed, or disposed, between reference planes, either GND or power ("PWR") and surrounded by dielectric. Additional configurations are also contemplated, including symmetric striplines, asymmetric striplines, differential striplines, and broadside striplines. Waveguides can be coplanar waveguide, optical waveguide (including polymer waveguides and laser written polymer waveguides), or any other suitable waveguide. Different configurations of the above features may be adjusted within the electronic assembly to accommodate device requirements, desirable outputs and needed constraints, such as yield, cost, and performance as well as other needs.

FIG. 4B, continuing from FIG. 4A, illustrates an additional conductive layer being formed over the flat upper surface of encapsulant and conductive material.

FIG. 4C, similar to FIGS. 4A-4C, illustrates an isometric view of a part or portion of the molded build-up or multi-layer interconnect structure 186. FIG. 4C illustrates how a layer of encapsulant within the multi-layer interconnect structure 186, may comprises one or more additional components 14 disposed therein, whether active or passive devices.

Figure 5:
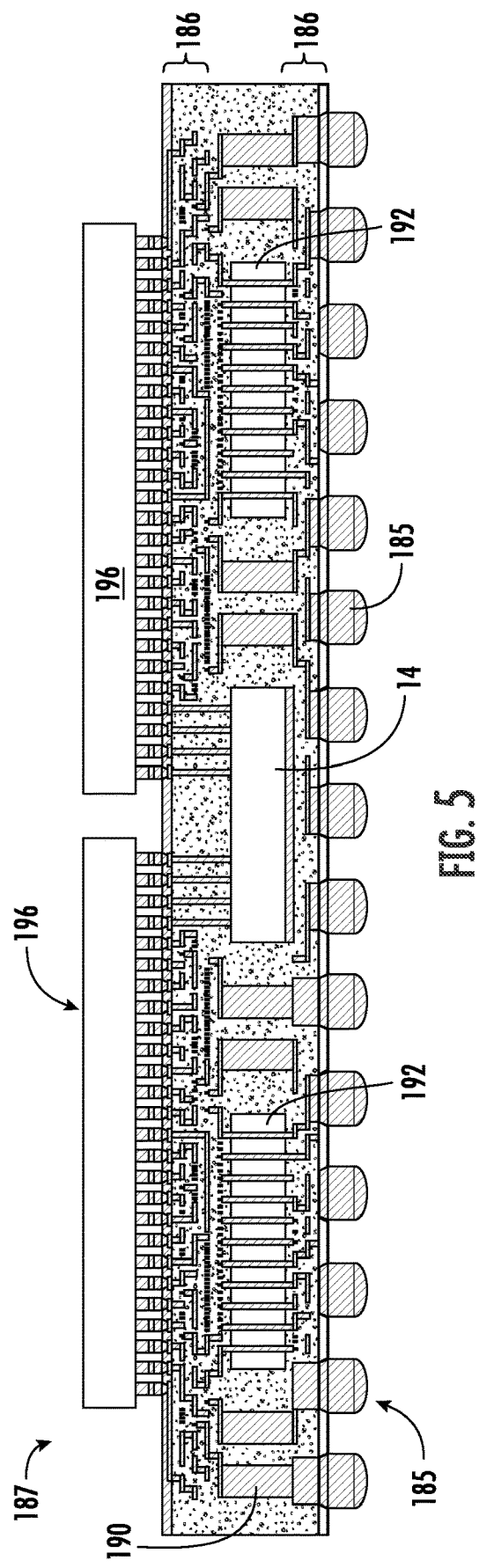
FIG. 5 illustrates forming molded direct contact interconnect build-up or multi-layer structures on first and second opposing sides of a component and a through silicon via (TSV) component, so as to form an interposer, provide contact pads for package-on-package, or provide pads for backside mounting of additional components including SMTs, BGAs, QFNs, or other package types.

FIG. 5 illustrates forming molded direct contact interconnect build-up or multi-layer structures 186 on first and second opposing sides of a component 14 and TSV components 192, so as to form an interposer. The electronic assembly 187 can include build-up layers or multi-layers 186 on or over both sides of the component 14 (i.e. over active layer or first surface 20 and backside surface 18). The electronic assembly 187 may comprise the component 14 being a bridge chip, or any other suitable component. The electronic assembly 187 may also comprise through mold vias (TMVs) or electrical interconnects or contacts 190 and may be formed as a package-on-package (PoP) assembly. The electronic assembly 187 may further comprise stacked components or chips 196, such as one or more of face to face stacked, TSV stacked, flip chip mounted, or any other suitable arrangement whether within encapsulant or without encapsulant.

Figure 6:
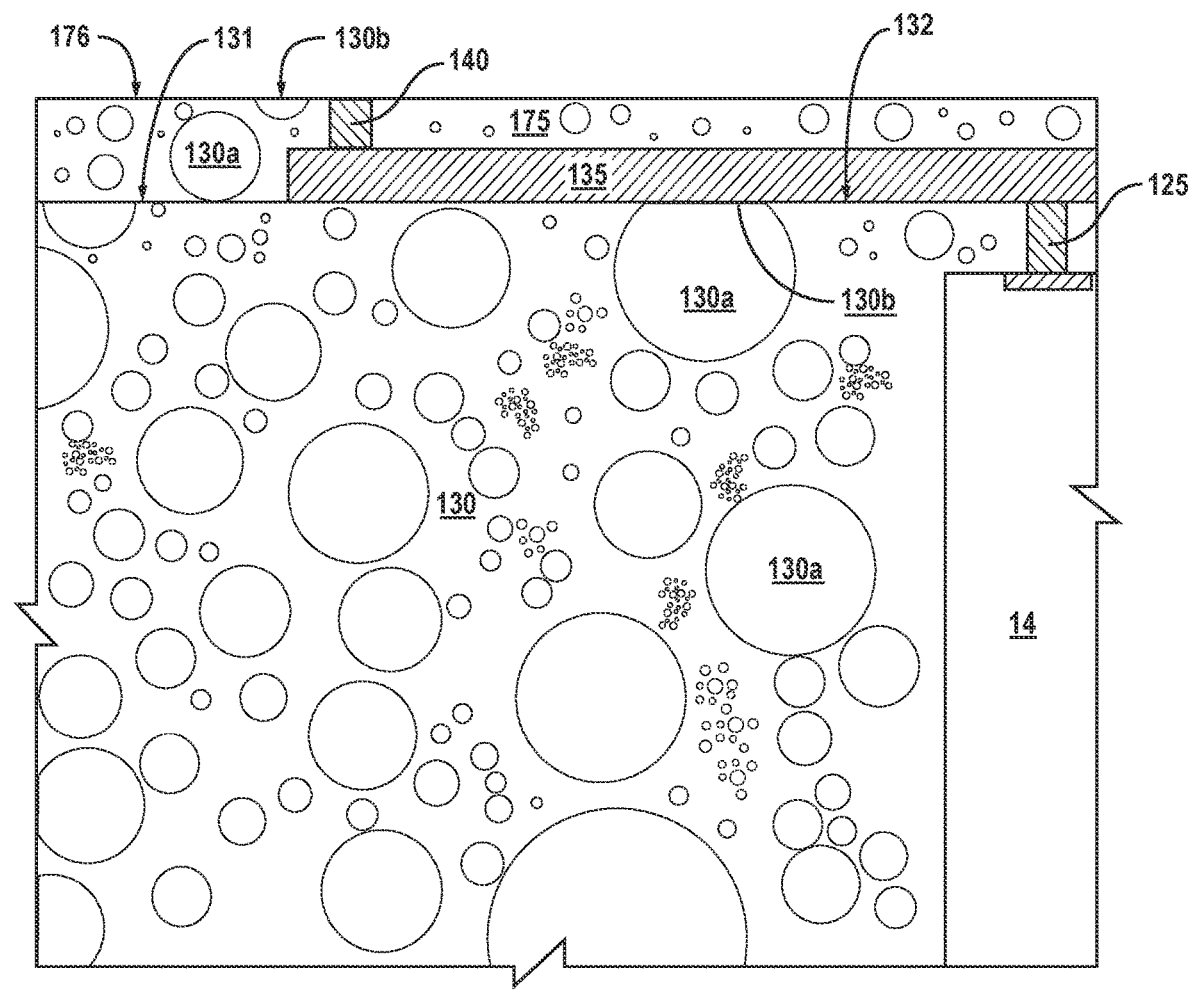
FIG. 6 illustrates an enlarged cross-sectional side view of encapsulant within a final electronic assembly.

FIG. 6 illustrates an enlarged cross-sectional side view of the first encapsulant layer 130 within a final electronic assembly 187, and further shows detail of the encapsulant and filler 130a withing the encapsulant 120 after the encapsulant 130 that has undergone the one or more planarizing, grinding, polishing, or CMP process to create flat surface 132. Each layer of encapsulant may comprise an organic material with filler, a mold compound with filler, a composite material with filler, an epoxy resin with filler, or an epoxy acrylate with filler. The filler particles 130a may comprise a generally spherical shape, as shown by the circular cross-sections in FIG. 6. At a boundary of the first encapsulant layer 130 at the flat surface 132, the filler particles 130a may comprise non-spherical shapes from planarizing, grinding, polishing, or CMP, and further comprise flat surfaces 130b that are coextensive with the flat surface 132, a portion of the filler having been removed by the grinding process. In other words, the filler 130a within the encapsulant 130 comprises s a non-spherical or non-rounded particles at the surface 131 of the encapsulant 130. Each subsequent encapsulant layer will comprises a similar feature with filler particles 130a comprising flat surfaces 130b where the encapsulant layer has undergone a planarizing, grinding, polishing, or CMP process.

While this disclosure includes a number of embodiments in different forms, the particular embodiments presented are with the understanding that the present disclosure is to be considered as an exemplification of the principles of the disclosed structures, devices, methods, and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. An electronic assembly, comprising:
   a component comprising conductive studs over an active layer of the component, wherein each of the conductive studs comprises a first end directly connected to a contact pad coupled with the active layer and a second end opposite the first end wherein the second end is in a range of 2-50 micrometers (μm) from the first end;
   a first layer of encapsulant disposed around four side surfaces of the component, over the active layer of the component, and contacting at least a portion of the sides of the conductive studs;
   a substantially planar surface disposed over the active layer of the component, wherein the substantially planar surface comprises ends of the conductive studs and the first layer of encapsulant;
   a first conductive layer and first conductive stumps disposed over the first layer of encapsulant and configured to be electrically coupled with the conductive studs of the component;
   a second layer of encapsulant disposed over the first conductive layer and surrounding at least a portion of the first conductive stumps, wherein ends of the first conductive stumps are exposed with respect to the second layer of encapsulant;
   a second conductive layer and second conductive stumps disposed over the second layer of encapsulant and configured to be electrically coupled with the first conductive layer and first conductive stumps;
   a third layer of encapsulant disposed over the second conductive layer and surrounding at least a portion of the second conductive stumps, wherein ends of the second conductive stumps are exposed with respect to the third layer of encapsulant;
   a conductive contact disposed over, or within, the third layer of encapsulant and configured to be electrically coupled to the component through one or more of the first conductive stump and the second conductive stumps;
   wherein the first layer of encapsulant, the second layer of encapsulant, and the third layer of encapsulant comprise a surface roughness of less than 500 nanometers (nm) over a characteristic measurement distance;
   wherein the first conductive layer and the second conductive layer comprise lower surfaces comprising corresponding surface roughness less than 500 nm over a characteristic measurement distance; and
   wherein the first conductive stumps are formed of a single layer of material and at least a portion of the sidewalls of the first conductive stumps directly contact the second encapsulant.

2. The electronic assembly of claim 1, wherein at least a portion of the first conductive layer or the second conductive layer are formed using unit specific patterning, such that:
   at least a portion of the first conductive layer comprises a misalignment less than an average misalignment for the first conductive layer; and
   at least a portion of the second conductive layer comprises a misalignment less than an average misalignment for the second conductive layer.

3. The electronic assembly of claim 2, wherein the second layer of encapsulant and the third layer of encapsulant are formed without components disposed therein.

4. The electronic assembly of claim 1, wherein the conductive contact comprises one or more of an input electrical contact, an output electrical contact, an IO contact, a power contact, a ground contact, a clock contact, electrical contacts, a bump, a solder ball, a solder bump, a BGA, a LGA, contact pads, copper pillars, and copper pillars with solder, to couple with structures outside the electronic assembly.

5. The electronic assembly of claim 1, wherein:
   the first encapsulant layer, the second encapsulant layer, and the third encapsulant layer each comprise an organic material with filler, a mold compound with filler, a composite material with filler, an epoxy resin with filler, or an epoxy acrylate with filler; and filler particles at a boundary of the first encapsulant layer, the second encapsulant layer, and the third encapsulant layer comprise non-spherical shapes from grinding, polishing, or chemical mechanical polishing (CMP).

6. The electronic assembly of claim 1, wherein the conductive stumps are formed with a cross-sectional distance in a first direction less than or equal to 45 µm and at a pitch in the first direction of less than or equal to 55 µm.

7. The electronic assembly of claim 1, wherein at least one of the conductive traces is coupled to at least one conductive stud such that the at least one conductive trace is narrower in at least one direction than a greatest width of the at least one conductive stud.

8. An electronic assembly, comprising:
a component comprising conductive studs disposed over an active layer of the component, wherein each of the conductive studs comprises a first end directly connected to a contact pad coupled with the active layer;
a first encapsulant layer disposed around four side surfaces of the component, over the active layer of the component, and contacting at least a portion of the sides of the conductive studs;
a substantially planar surface disposed over the active layer of the component, wherein the substantially planar surface comprises ends of the conductive studs and a planar surface of the first encapsulant layer, wherein the planar surface of the first encapsulant layer comprises a roughness less than 500 nanometers (nm) over a characteristic measurement distance;
first conductive elements disposed over the first encapsulant layer and configured to be electrically coupled with the conductive studs of the component;
a second layer of encapsulant disposed over, and surrounding at least a portion of, the first conductive elements and the first encapsulant layer, wherein at least a portion of the first conductive elements are exposed with respect to the second layer of encapsulant; and
a conductive contact disposed over, or within, the second layer of encapsulant for IO interconnection and configured to be electrically coupled through the first conductive elements to the component.

9. The electronic assembly of claim 8, wherein the conductive elements comprise conductive stumps and a first conductive layer, wherein the first conductive layer comprises one or more of a redistribution layer (RDL), trace, or contact pad.

10. The electronic assembly of claim 8, further comprising alternating layers of additional conductive elements with alternating layers of encapsulant to form two to twelve layers of conductive elements.

11. The electronic assembly of claim 8, wherein at least a portion of the first conductive elements is formed using unit specific patterning, such that at least a portion of the first conductive layer comprises a misalignment less than an average misalignment for the first conductive layer.

12. The electronic assembly of claim 8, wherein the second layer of encapsulant is formed without components disposed therein.

13. The electronic assembly of claim 10, wherein:
the first encapsulant layer and the second encapsulant layer each comprise an organic material with filler, a mold compound with filler, a composite material with filler, an epoxy resin with filler, or an epoxy acrylate with filler; and filler particles at a boundary of the first encapsulant layer and the second encapsulant layer comprise non-spherical shapes from grinding, polishing, or chemical mechanical polishing (CMP).

14. The electronic assembly of claim 8, wherein the conductive contact comprises one or more of an input electrical contact, an output electrical contact, an IO contact, a power contact, a ground contact, a clock contact, electrical contacts, a bump, a solder ball, a solder bump, a BGA, a LGA, contact pads, copper pillars, and copper pillars with solder, to couple with structures outside the electronic assembly.

15. The electronic assembly of claim 8, wherein the first conductive elements comprise conductive stumps, wherein the conductive stumps are formed of a single layer of material and sidewalls of the first conductive stumps directly contact the second encapsulant.

16. The electronic assembly of claim 8, wherein the first conductive elements comprise conductive stumps, wherein the conductive stumps are formed with a cross-sectional distance in a first direction less than or equal to 12 µm and at a pitch in the first direction of less than or equal to 25 µm.

17. The electronic assembly of claim 8, wherein the first conductive elements comprise a first conductive layer, wherein the first conductive layer comprises a redistribution layer (RDL) with a line and space width of less than or equal to 5 µm.

18. The electronic assembly of claim 9, wherein the first conductive elements comprise a first conductive layer, wherein the first conductive layer comprises a corresponding surface roughness within a range of 5 to 500 nm over a characteristic measurement distance.

19. An electronic assembly, comprising:
a component comprising conductive studs disposed over a first surface of the component;
a first encapsulant layer disposed around four side surfaces of the component, over the first surface of the component, and contacting at least a portion of the sides of the conductive studs;
a substantially planar surface disposed over the first surface of the component, wherein the substantially planar surface comprises ends of the conductive studs and a planar surface of the first encapsulant layer, wherein the planar surface of the first encapsulant layer comprises a roughness less than 500 nanometers (nm) over a characteristic measurement distance; and
first conductive elements disposed over the first encapsulant layer and configured to be electrically coupled with the conductive studs of the component.

20. The electronic assembly of claim 19, wherein the ends of the conductive studs are recessed below the planar surface of the first encapsulant by a distance of 10 µm or less.

21. The electronic assembly of claim 19, wherein the first conductive elements comprise one or more of conductive stumps and a first conductive layer, wherein the first conductive layer comprises one or more of a redistribution layer (RDL), trace, or contact pad.

22. The electronic assembly of claim 19, wherein the first conductive elements are formed with a second encapsulant layer formed as a single encapsulant disposed over the first conductive elements and the first encapsulant layer.

23. The electronic assembly of claim 19, further comprising one or more additional layers of alternating conductive elements and layers of encapsulant to form two or more conductive elements, wherein the two or more conductive elements comprise two or more layers of conductive stumps disposed over a first surface of the component, wherein a connection between conductive stumps between layers is done without use of capture pads.

24. The electronic assembly of claim 22, wherein the second layer of encapsulant is formed without components disposed therein.

25. The electronic assembly of claim 22, wherein the second layer of encapsulant comprises one or more additional components disposed therein.

26. The electronic assembly of claim 19, further comprising conductive contacts that comprise one or more of: an input electrical contact, an output electrical contact, an IO contact, power contact, ground contact, clock contact, electrical contacts, a bump, a solder ball, a solder bump, a BGA, a LGA, contact pads, copper pillars, and copper pillars with solder, to couple with devices outside the electronic assembly.

27. The electronic assembly of claim 22, wherein the first conductive stumps are formed of a single layer of material and at least a portion of sidewalls of the first conductive stumps directly contact the second encapsulant.

28. The electronic assembly of claim 19, wherein the conductive stumps are formed with a minimum width less than or equal to 12 μm and at a minimum pitch of less than or equal to 25 μm.

29. The electronic assembly of claim 19, wherein the first conductive element further comprises a trace with a line and space width of less than or equal to 5 μm.

30. The electronic assembly of claim 19, further comprising a first conductive layer comprising a lower surface comprising a surface roughness less than 500 nm over a characteristic measurement distance.

\* \* \* \* \*